(12) United States Patent
Weingarten et al.

(10) Patent No.: US 8,443,242 B2
(45) Date of Patent: May 14, 2013

(54) SYSTEMS AND METHODS FOR MULTIPLE CODING RATES IN FLASH DEVICES

(75) Inventors: Hanan Weingarten, Herzelia (IL); Michael Katz, Haifa (IL)

(73) Assignee: Densbits Technologies Ltd., Haifa (IL)

( * ) Notice: Subject to any disclaimer, the term of this patent is extended or adjusted under 35 U.S.C. 154(b) by 524 days.

(21) Appl. No.: 12/595,959

(22) PCT Filed: Sep. 17, 2008

(86) PCT No.: PCT/IL2008/001228
§ 371 (c)(1),
(2), (4) Date: Oct. 15, 2009

(87) PCT Pub. No.: WO2009/053961
PCT Pub. Date: Apr. 30, 2009

(65) Prior Publication Data
US 2010/0088557 A1  Apr. 8, 2010

Related U.S. Application Data

(60) Provisional application No. 60/996,027, filed on Oct. 25, 2007, provisional application No. 60/996,782, filed on Dec. 5, 2007, provisional application No. 61/006,805, filed on Jan. 31, 2008, provisional application No. 61/064,853, filed on Mar. 31, 2008, provisional application No. 61/071,465, filed on Apr. 30, 2008, provisional application No. 61/071,466, filed on Apr. 30, 2008, provisional application No. 61/129,608, filed on Jul. 8, 2008.

(51) Int. Cl.
*G06F 11/00* (2006.01)

(52) U.S. Cl.
USPC .......................................................... 714/704

(58) Field of Classification Search ................. 714/746, 714/704, 736, 718, 776, 799; 365/201, 185.33, 365/230.03
See application file for complete search history.

(56) References Cited

U.S. PATENT DOCUMENTS

| 4,463,375 A | 7/1984 | Macovski |
| 4,584,686 A | 4/1986 | Fritze |

(Continued)

FOREIGN PATENT DOCUMENTS
WO  WO 2006/013529  2/2006

OTHER PUBLICATIONS

International Search Report for International Application No. PCT/IL08/01228 mailed Jan. 28, 2009.
Search Report of PCT Patent Application WO 2009/118720 A3.
Search Report of PCT Patent Application WO 2009/095902 A3.
Search Report of PCT Patent Application WO 2009/078006 A3.
Search Report of PCT Patent Application WO 2009/074979 A3.

(Continued)

*Primary Examiner* — Phung M Chung
(74) *Attorney, Agent, or Firm* — Dentons US LLP

(57) ABSTRACT

A system and method for encoding information arriving from a host in order to store the coded information in flash memory, the method comprising encoding information arriving from a host for storage at a flash memory location including generating a number of redundancy bytes, the encoding proceeding at an encoding rate which is a function of the number of redundancy bytes generated, the encoding including determining an effective error rate, including an anticipated rate of expected reading errors, for the flash memory location; and selecting the encoding rate as a function of the effective error rate such that the number of redundancy bytes is sufficient to overcome the anticipated rate of expected reading errors with a predetermined degree of certainty.

14 Claims, 18 Drawing Sheets

U.S. PATENT DOCUMENTS

| | | | |
|---|---|---|---|
| 4,589,084 A | 5/1986 | Fling et al. | |
| 4,866,716 A | 9/1989 | Weng | |
| 5,077,737 A | 12/1991 | Leger et al. | |
| 5,297,153 A | 3/1994 | Baggen et al. | |
| 5,657,332 A | 8/1997 | Auclair et al. | |
| 5,729,490 A | 3/1998 | Calligaro et al. | |
| 5,793,774 A | 8/1998 | Usui et al. | |
| 5,926,409 A | 7/1999 | Engh et al. | |
| 5,956,268 A | 9/1999 | Lee | |
| 5,982,659 A | 11/1999 | Irrinki et al. | |
| 6,038,634 A | 3/2000 | Ji et al. | |
| 6,094,465 A * | 7/2000 | Stein et al. | 375/346 |
| 6,119,245 A | 9/2000 | Hiratsuka | |
| 6,182,261 B1 | 1/2001 | Haller et al. | |
| 6,192,497 B1 | 2/2001 | Yang et al. | |
| 6,195,287 B1 | 2/2001 | Hirano | |
| 6,199,188 B1 | 3/2001 | Shen et al. | |
| 6,209,114 B1 | 3/2001 | Wolf et al. | |
| 6,259,627 B1 | 7/2001 | Wong | |
| 6,278,633 B1 | 8/2001 | Wong et al. | |
| 6,279,133 B1 | 8/2001 | Vafai et al. | |
| 6,301,151 B1 | 10/2001 | Engh et al. | |
| 6,370,061 B1 | 4/2002 | Yachareni et al. | |
| 6,374,383 B1 | 4/2002 | Weng | |
| 6,504,891 B1 | 1/2003 | Chevallier | |
| 6,532,169 B1 | 3/2003 | Mann et al. | |
| 6,532,556 B1 | 3/2003 | Wong et al. | |
| 6,553,533 B2 | 4/2003 | Demura et al. | |
| 6,560,747 B1 | 5/2003 | Weng | |
| 6,637,002 B1 | 10/2003 | Weng et al. | |
| 6,639,865 B2 | 10/2003 | Kwon | |
| 6,674,665 B1 | 1/2004 | Mann et al. | |
| 6,704,902 B1 | 3/2004 | Shinbashi et al. | |
| 6,751,766 B2 | 6/2004 | Guterman et al. | |
| 6,772,274 B1 | 8/2004 | Estakhri | |
| 6,781,910 B2 | 8/2004 | Smith | |
| 6,792,569 B2 | 9/2004 | Cox et al. | |
| 6,873,543 B2 | 3/2005 | Smith et al. | |
| 6,891,768 B2 | 5/2005 | Smith et al. | |
| 6,914,809 B2 | 7/2005 | Hilton et al. | |
| 6,915,477 B2 | 7/2005 | Gollamudi et al. | |
| 6,952,365 B2 | 10/2005 | Gonzalez et al. | |
| 6,961,890 B2 | 11/2005 | Smith | |
| 6,990,012 B2 | 1/2006 | Smith et al. | |
| 6,996,004 B1 | 2/2006 | Fastow et al. | |
| 6,999,854 B2 | 2/2006 | Roth | |
| 7,010,739 B1 | 3/2006 | Feng et al. | |
| 7,012,835 B2 | 3/2006 | Gonzalez et al. | |
| 7,038,950 B1 | 5/2006 | Hamilton et al. | |
| 7,068,539 B2 | 6/2006 | Guterman et al. | |
| 7,079,436 B2 | 7/2006 | Perner et al. | |
| 7,149,950 B2 | 12/2006 | Spencer et al. | |
| 7,177,977 B2 | 2/2007 | Chen et al. | |
| 7,191,379 B2 | 3/2007 | Adelmann et al. | |
| 7,196,946 B2 | 3/2007 | Chen et al. | |
| 7,203,874 B2 | 4/2007 | Roohparvar | |
| 7,290,203 B2 | 10/2007 | Emma et al. | |
| 7,292,365 B2 | 11/2007 | Knox | |
| 7,301,928 B2 * | 11/2007 | Nakabayashi et al. | 370/338 |
| 7,441,067 B2 | 10/2008 | Gorobets et al. | |
| 7,466,575 B2 | 12/2008 | Shalvi et al. | |
| 7,533,328 B2 | 5/2009 | Alrod et al. | |
| 7,558,109 B2 | 7/2009 | Brandman et al. | |
| 7,593,263 B2 | 9/2009 | Sokolov et al. | |
| 7,697,326 B2 | 4/2010 | Sommer et al. | |
| 7,706,182 B2 | 4/2010 | Shalvi et al. | |
| 7,804,718 B2 | 9/2010 | Kim | |
| 7,805,663 B2 | 9/2010 | Brandman et al. | |
| 7,805,664 B1 | 9/2010 | Yang et al. | |
| 7,844,877 B2 | 11/2010 | Litsyn et al. | |
| 7,961,797 B1 | 6/2011 | Yang et al. | |
| 8,020,073 B2 | 9/2011 | Emma et al. | |
| 8,122,328 B2 | 2/2012 | Liu et al. | |
| 2002/0063774 A1 | 5/2002 | Hillis et al. | |
| 2002/0085419 A1 | 7/2002 | Kwon et al. | |
| 2002/0154769 A1 | 10/2002 | Petersen et al. | |
| 2003/0065876 A1 | 4/2003 | Lasser | |
| 2003/0101404 A1 | 5/2003 | Zhao et al. | |
| 2003/0105620 A1 | 6/2003 | Bowen | |
| 2003/0192007 A1 | 10/2003 | Miller et al. | |
| 2004/0015771 A1 | 1/2004 | Lasser et al. | |
| 2004/0030971 A1 | 2/2004 | Tanaka et al. | |
| 2004/0153722 A1 | 8/2004 | Lee | |
| 2004/0153817 A1 | 8/2004 | Norman et al. | |
| 2004/0181735 A1 | 9/2004 | Xin | |
| 2005/0013165 A1 | 1/2005 | Ban | |
| 2005/0018482 A1 | 1/2005 | Cemea et al. | |
| 2005/0083735 A1 | 4/2005 | Chen et al. | |
| 2005/0117401 A1 | 6/2005 | Chen et al. | |
| 2005/0120265 A1 * | 6/2005 | Pline et al. | 714/7 |
| 2005/0128811 A1 | 6/2005 | Kato et al. | |
| 2005/0138533 A1 | 6/2005 | Le-Bars et al. | |
| 2005/0144213 A1 | 6/2005 | Simkins et al. | |
| 2005/0144368 A1 | 6/2005 | Chung et al. | |
| 2005/0169057 A1 | 8/2005 | Shibata et al. | |
| 2005/0172179 A1 | 8/2005 | Brandenberger et al. | |
| 2005/0213393 A1 | 9/2005 | Lasser | |
| 2006/0059406 A1 | 3/2006 | Micheloni et al. | |
| 2006/0059409 A1 | 3/2006 | Lee | |
| 2006/0064537 A1 | 3/2006 | Oshima et al. | |
| 2006/0101193 A1 | 5/2006 | Murin | |
| 2006/0203587 A1 | 9/2006 | Li et al. | |
| 2006/0221692 A1 | 10/2006 | Chen | |
| 2006/0248434 A1 | 11/2006 | Radke et al. | |
| 2006/0268608 A1 | 11/2006 | Noguchi et al. | |
| 2006/0294312 A1 | 12/2006 | Walmsley | |
| 2007/0025157 A1 | 2/2007 | Wan et al. | |
| 2007/0063180 A1 | 3/2007 | Asano et al. | |
| 2007/0103992 A1 | 5/2007 | Sakui et al. | |
| 2007/0104004 A1 | 5/2007 | So et al. | |
| 2007/0109858 A1 | 5/2007 | Conley et al. | |
| 2007/0124652 A1 | 5/2007 | Litsyn et al. | |
| 2007/0143561 A1 | 6/2007 | Gorobets | |
| 2007/0150694 A1 | 6/2007 | Chang et al. | |
| 2007/0168625 A1 | 7/2007 | Cornwell et al. | |
| 2007/0171714 A1 | 7/2007 | Wu et al. | |
| 2007/0171730 A1 | 7/2007 | Ramamoorthy et al. | |
| 2007/0180346 A1 | 8/2007 | Murin | |
| 2007/0223277 A1 | 9/2007 | Tanaka et al. | |
| 2007/0226582 A1 | 9/2007 | Tang et al. | |
| 2007/0226592 A1 | 9/2007 | Radke | |
| 2007/0228449 A1 | 10/2007 | Takano et al. | |
| 2007/0253249 A1 | 11/2007 | Kang et al. | |
| 2007/0253250 A1 | 11/2007 | Shibata et al. | |
| 2007/0263439 A1 | 11/2007 | Cornwell et al. | |
| 2007/0266291 A1 | 11/2007 | Toda et al. | |
| 2007/0271494 A1 | 11/2007 | Gorobets | |
| 2008/0010581 A1 | 1/2008 | Alrod et al. | |
| 2008/0028014 A1 | 1/2008 | Hilt et al. | |
| 2008/0055989 A1 | 3/2008 | Lee et al. | |
| 2008/0082897 A1 | 4/2008 | Brandman et al. | |
| 2008/0092026 A1 | 4/2008 | Brandman et al. | |
| 2008/0104309 A1 | 5/2008 | Cheon et al. | |
| 2008/0116509 A1 | 5/2008 | Harari et al. | |
| 2008/0126686 A1 | 5/2008 | Sokolov et al. | |
| 2008/0127104 A1 | 5/2008 | Li et al. | |
| 2008/0128790 A1 | 6/2008 | Jung | |
| 2008/0130341 A1 | 6/2008 | Shalvi et al. | |
| 2008/0137413 A1 | 6/2008 | Kong et al. | |
| 2008/0148115 A1 | 6/2008 | Sokolov et al. | |
| 2008/0158958 A1 | 7/2008 | Shalvi et al. | |
| 2008/0159059 A1 | 7/2008 | Moyer | |
| 2008/0162079 A1 | 7/2008 | Astigarraga et al. | |
| 2008/0168216 A1 | 7/2008 | Lee | |
| 2008/0168320 A1 * | 7/2008 | Cassuto et al. | 714/746 |
| 2008/0181001 A1 | 7/2008 | Shalvi | |
| 2008/0198650 A1 | 8/2008 | Shalvi et al. | |
| 2008/0198652 A1 | 8/2008 | Shalvi et al. | |
| 2008/0219050 A1 | 9/2008 | Shalvi et al. | |
| 2008/0225599 A1 | 9/2008 | Chae | |
| 2008/0263262 A1 | 10/2008 | Sokolov et al. | |
| 2008/0282106 A1 | 11/2008 | Shalvi et al. | |
| 2008/0285351 A1 | 11/2008 | Shlick et al. | |
| 2008/0301532 A1 | 12/2008 | Uchikawa et al. | |
| 2009/0024905 A1 | 1/2009 | Shalvi et al. | |
| 2009/0043951 A1 | 2/2009 | Shalvi et al. | |
| 2009/0072303 A9 | 3/2009 | Prall et al. | |

| | | | |
|---|---|---|---|
| 2009/0091979 A1 | 4/2009 | Shalvi | |
| 2009/0103358 A1 | 4/2009 | Sommer et al. | |
| 2009/0106485 A1 | 4/2009 | Anholt | |
| 2009/0113275 A1 | 4/2009 | Chen et al. | |
| 2009/0125671 A1 | 5/2009 | Flynn et al. | |
| 2009/0144600 A1 | 6/2009 | Perlmutter et al. | |
| 2009/0150748 A1 | 6/2009 | Egner et al. | |
| 2009/0157964 A1 | 6/2009 | Kasorla et al. | |
| 2009/0158126 A1 | 6/2009 | Perlmutter et al. | |
| 2009/0168524 A1 | 7/2009 | Golov et al. | |
| 2009/0187803 A1 | 7/2009 | Anholt et al. | |
| 2009/0199074 A1 | 8/2009 | Sommer | |
| 2009/0213653 A1 | 8/2009 | Perlmutter et al. | |
| 2009/0213654 A1 | 8/2009 | Perlmutter et al. | |
| 2009/0228761 A1 | 9/2009 | Perlmutter et al. | |
| 2009/0240872 A1 | 9/2009 | Perlmutter et al. | |
| 2010/0005270 A1 | 1/2010 | Jiang | |
| 2010/0058146 A1 | 3/2010 | Weingarten et al. | |
| 2010/0064096 A1 | 3/2010 | Weingarten et al. | |
| 2010/0088557 A1 | 4/2010 | Weingarten et al. | |
| 2010/0091535 A1 | 4/2010 | Sommer et al. | |
| 2010/0095186 A1 | 4/2010 | Weingarten | |
| 2010/0110787 A1 | 5/2010 | Shalvi et al. | |
| 2010/0115376 A1 | 5/2010 | Shalvi et al. | |
| 2010/0122113 A1 | 5/2010 | Weingarten et al. | |
| 2010/0124088 A1 | 5/2010 | Shalvi et al. | |
| 2010/0131580 A1 | 5/2010 | Kanter et al. | |
| 2010/0131806 A1 | 5/2010 | Weingarten et al. | |
| 2010/0131809 A1 | 5/2010 | Katz | |
| 2010/0131826 A1 | 5/2010 | Shalvi et al. | |
| 2010/0131827 A1 | 5/2010 | Sokolov et al. | |
| 2010/0131831 A1 | 5/2010 | Weingarten et al. | |
| 2010/0146191 A1 | 6/2010 | Katz | |
| 2010/0146192 A1 | 6/2010 | Weingarten et al. | |
| 2010/0149881 A1 | 6/2010 | Lee et al. | |
| 2010/0180073 A1 | 7/2010 | Weingarten et al. | |
| 2010/0199149 A1 | 8/2010 | Weingarten et al. | |
| 2010/0211724 A1 | 8/2010 | Weingarten | |
| 2010/0211833 A1 | 8/2010 | Weingarten | |
| 2010/0211856 A1 | 8/2010 | Weingarten | |
| 2010/0251066 A1* | 9/2010 | Radke | 714/752 |
| 2010/0253555 A1 | 10/2010 | Weingarten et al. | |
| 2010/0257309 A1 | 10/2010 | Barsky et al. | |
| 2010/0293321 A1 | 11/2010 | Weingarten | |
| 2011/0051521 A1 | 3/2011 | Levy et al. | |
| 2011/0055461 A1 | 3/2011 | Steiner et al. | |
| 2011/0096612 A1 | 4/2011 | Steiner et al. | |
| 2011/0119562 A1 | 5/2011 | Steiner et al. | |
| 2011/0153919 A1 | 6/2011 | Sabbag | |
| 2011/0161775 A1 | 6/2011 | Weingarten | |
| 2011/0214029 A1 | 9/2011 | Steiner et al. | |
| 2011/0214039 A1 | 9/2011 | Steiner et al. | |
| 2011/0246792 A1 | 10/2011 | Weingarten | |
| 2011/0246852 A1 | 10/2011 | Sabbag | |
| 2011/0252187 A1 | 10/2011 | Segal et al. | |
| 2011/0252188 A1 | 10/2011 | Weingarten | |
| 2011/0271043 A1 | 11/2011 | Segal et al. | |
| 2011/0302428 A1 | 12/2011 | Weingarten | |
| 2012/0001778 A1 | 1/2012 | Steiner et al. | |
| 2012/0005554 A1 | 1/2012 | Steiner et al. | |
| 2012/0005558 A1 | 1/2012 | Steiner et al. | |
| 2012/0005560 A1 | 1/2012 | Steiner et al. | |
| 2012/0008401 A1 | 1/2012 | Katz et al. | |
| 2012/0008414 A1 | 1/2012 | Katz et al. | |
| 2012/0051144 A1 | 3/2012 | Weingarten et al. | |
| 2012/0063227 A1 | 3/2012 | Weingarten et al. | |
| 2012/0066441 A1 | 3/2012 | Weingarten | |
| 2012/0110250 A1 | 5/2012 | Sabbag et al. | |

OTHER PUBLICATIONS

Search Report of PCT Patent Application WO 2009/074978 A3.
Search Report of PCT Patent Application WO 2009/072105 A3.
Search Report of PCT Patent Application WO 2009/072104 A3.
Search Report of PCT Patent Application WO 2009/072103 A3.
Search Report of PCT Patent Application WO 2009/072102 A3.
Search Report of PCT Patent Application WO 2009/072101 A3.
Search Report of PCT Patent Application WO 2009/072100 A3.
Search Report of PCT Patent Application WO 2009/053963 A3.
Search Report of PCT Patent Application WO 2009/053962 A3.
Search Report of PCT Patent Application WO 2009/053961 A3.
Search Report of PCT Patent Application WO 2009/037697 A3.
Yani Chen, Keshab K. Parhi, "Small Area Parallel Chien Search Architectures for Long BCH Codes", Ieee Transactions on Very Large Scale Integration(VLSI) Systems, vol. 12, No. 5, May 2004.
Yuejian Wu, "Low Power Decoding of BCH Codes", Nortel Networks, Ottawa, Ont., Canada, in Circuits and systems. ISCAS '04. Proceeding of the 2004 International Symposium on Circuits and Systems, published May 23-26, 2004, vol. 2, pp. H-369-H-372 vol. 2.
Michael Purser, "Introduction to Error Correcting Codes", Artech House Inc., 1995.
Ron M. Roth, "Introduction to Coding Theory", Cambridge University Press, 2006.
Akash Kumar, Sergei Sawitzki, "High-Throughput and Low Power Architectures for Reed Solomon Decoder", (a.kumar at tue.nl, Eindhoven University of Technology and sergei.sawitzki at philips.com).
Todd K.Moon, "Error Correction Coding Mathematical Methods and Algorithms", A John Wiley & Sons, Inc., 2005.
Richard E. Blahut, "Algebraic Codes for Data Transmission", Cambridge University Press, 2003.
David Esseni, Bruno Ricco, "Trading-Off Programming Speed and Current Absorption in Flash Memories with the Ramped-Gate Programming Technique", Ieee Transactions on Electron Devices, vol. 47, No. 4, Apr. 2000.
Giovanni Campardo, Rino Micheloni, David Novosel, "VLSI-Design of Non-Volatile Memories", Springer Berlin Heidelberg New York, 2005.
John G. Proakis, "Digital Communications", 3rd ed., New York: McGraw-Hill, 1995.
J.M. Portal, H. Aziza, D. Nee, "EEPROM Memory: Threshold Voltage Built in Self Diagnosis", ITC International Test Conference, Paper 2.1.
J.M. Portal, H. Aziza, D. Nee, "EEPROM Diagnosis Based on Threshold Voltage Embedded Measurement", Journal of Electronic Testing: Theory and Applications 21, 33-42, 2005.
G. Tao, A. Scarpa, J. Dijkstra, W. Stidl, F. Kuper, "Data retention prediction for modern floating gate non-volatile memories", Microelectronics Reliability 40 (2000), 1561-1566.
T. Hirncno, N. Matsukawa, H. Hazama, K. Sakui, M. Oshikiri, K. Masuda, K. Kanda, Y. Itoh, J. Miyamoto, "A New Technique for Measuring Threshold Voltage Distribution in Flash EEPROM Devices", Proc. IEEE 1995 Int. Conference on Microelectronics Test Structures, vol. 8, Mar. 1995.
Boaz Eitan, Guy Cohen, Assaf Shappir, Eli Lusky, Amichai Givant, Meir Janai, Ilan Bloom, Yan Polansky, Oleg Dadashev, Avi Lavan, Ran Sahar, Eduardo Maayan, "4-bit per Cell NROM Reliability", Appears on the website of Saifun.com.
Paulo Cappelletti, Clara Golla, Piero Olivo, Enrico Zanoni, "Flash Memories", Kluwer Academic Publishers, 1999.
JEDEC Standard, "Stress-Test-Driven Qualification of Integrated Circuits", JEDEC Solid State Technology Association. JEDEC Standard No. 47F pp. 1-26.
Dempster, et al., "Maximum Likelihood from Incomplete Data via the EM Algorithm", Journal of the Royal Statistical Society. Series B (Methodological), vol. 39, No. 1 (1997), pp. 1-38.
Mielke, et al., "Flash EEPROM Threshold Instabilities due to Charge Trapping During Program/Erase Cycling", IEEE Transactions on Device and Materials Reliability, vol. 4, No. 3, Sep. 2004, pp. 335-344.
Daneshbeh, "Bit Serial Systolic Architectures for Multiplicative Inversion and Division over GF (2)", A thesis presented to the University of Waterloo, Ontario, Canada, 2005, pp. 1-118.
Chen, Formulas for the solutions of Quadratic Equations over GF (2), IEEE Trans. Inform. Theory, vol. IT-28, No. 5, Sep. 1982, pp. 792-794.
Berlekamp et al., "On the Solution of Algebraic Equations over Finite Fields", Inform. Cont. 10, Oct. 1967, pp. 553-564.

* cited by examiner

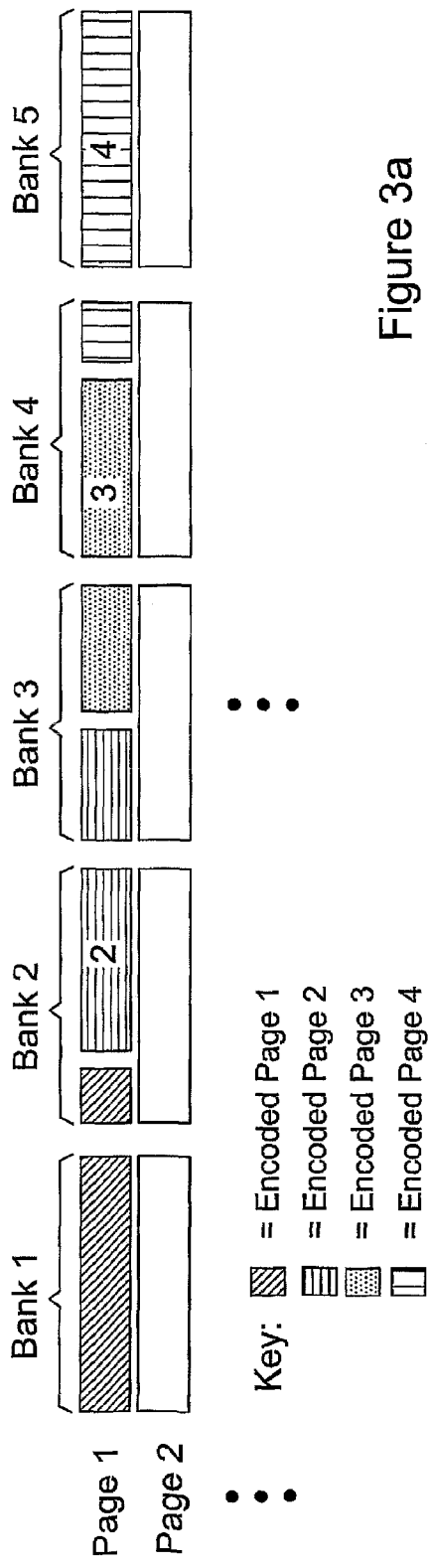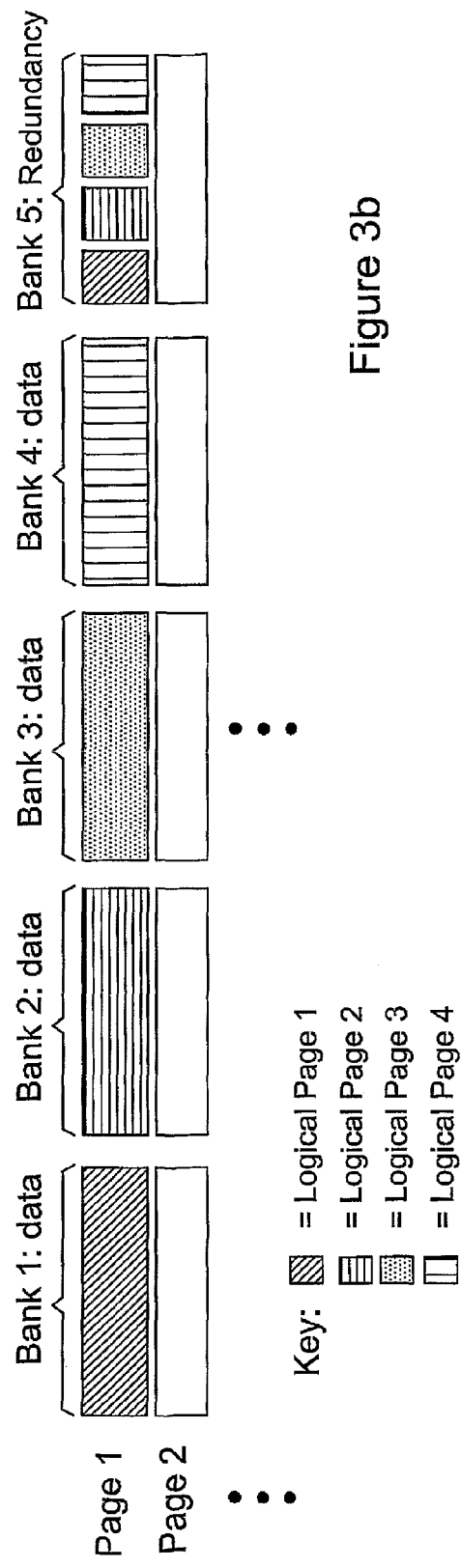
Figure 3a
Figure 3b

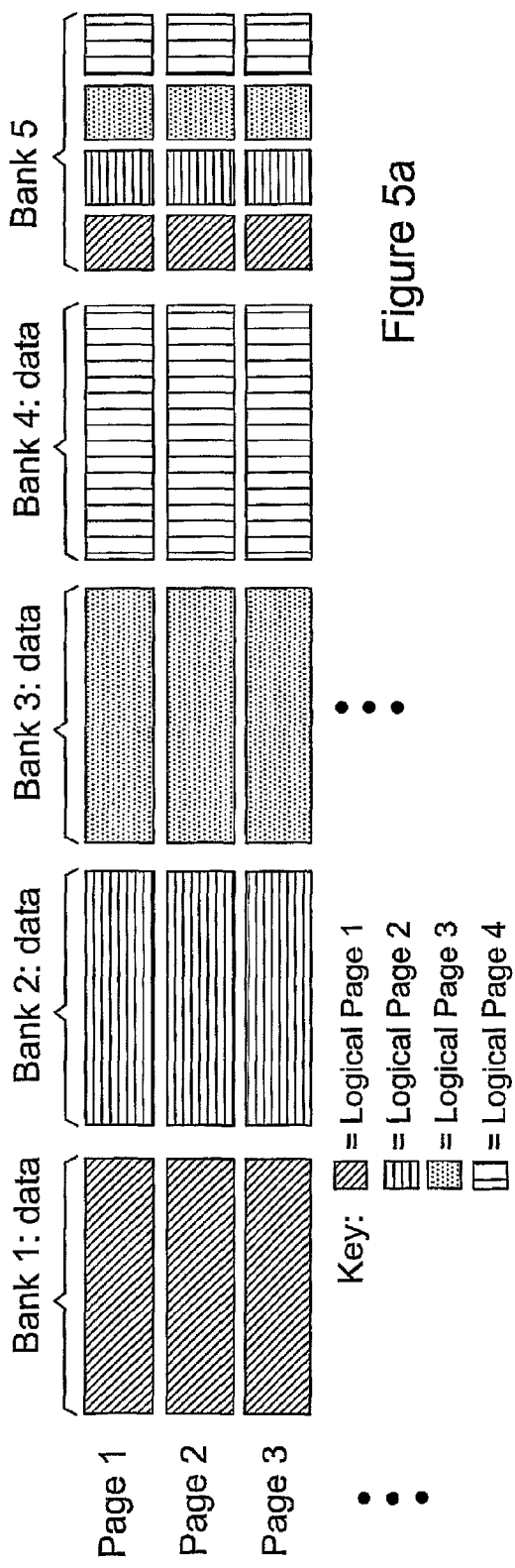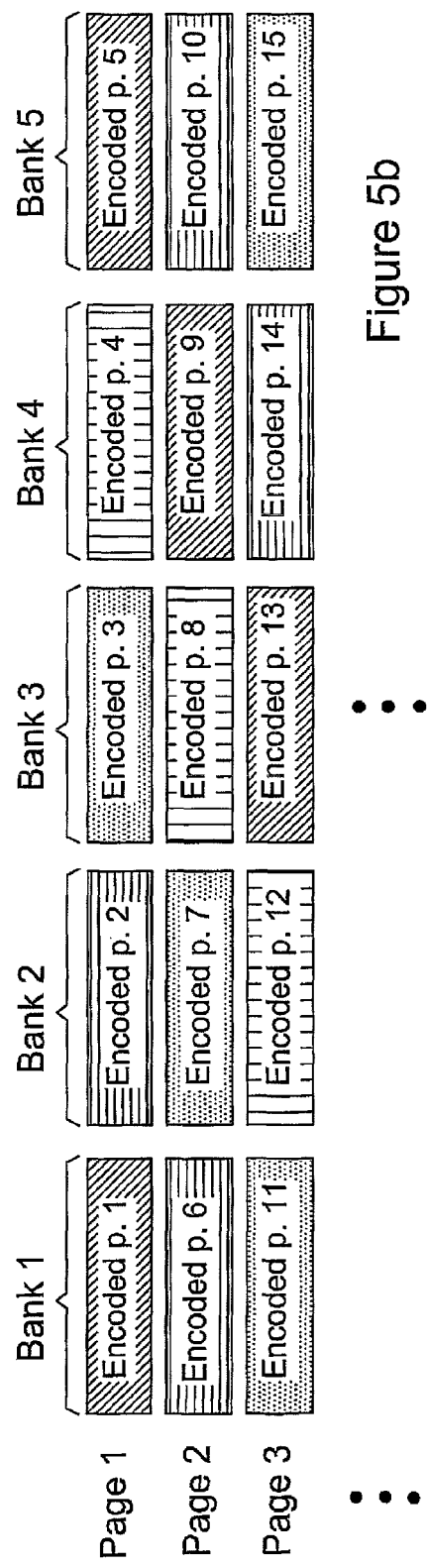

| Physical Block # | Cycle Count (Np) | # of "logical" pages in Block (#PagesPerBlock) | Allocated Logical Pages | Time Stamp |
|---|---|---|---|---|
| 0 | 10 | 128 | 128 | 1 Year ago |
| 1 | 7951 | 64 | 64 | 1 minute ago |
| 2 | 917 | 128 | 128 | 10 Hours ago |
| 3 | 3715 | 96 | 96 | 9 Hours ago |
| 4 | 4000 | 96 | 0 | 5 Hours ago |

| Logical page Address | Block # | Encoded Page # of first logical page (FirstPage#) | Logical Pages Programmed (OccupyVec) (32 bits) |
|---|---|---|---|
| 0 | 0 | 0 | 011011... |
| 32 | 0 | 32 | 101111... |
| 64 | 0 | 64 | 11111... |
| 96 | 0 | 96 | 11111... |
| 128 | 2 | 0 | 011011... |
| 160 | 2 | 32 | 101111... |
| 192 | 2 | 64 | 11111... |
| 224 | 2 | 96 | 11111... |
| 256 | 3 | 0 | 011011... |
| 288 | 3 | 32 | 101111... |
| 320 | 3 | 64 | 11111... |
| 352 | 4 | 0 | 11111... |
| 384 | 4 | 32 | 11111... |
| 416 | unallocated | | |

Figure 12

SYSTEMS AND METHODS FOR MULTIPLE CODING RATES IN FLASH DEVICES

CROSS REFERENCE TO RELATED APPLICATIONS

This application is a National Phase Application of PCT International Application No. PCT/IL2008/001228, entitled "SYSTEMS AND METHODS FOR MULTIPLE CODING RATES IN FLASH DEVICES", International Filing Date Sep. 17, 2008, published on Apr. 30, 2009 as International Publication No. WO 2009/053961, which in turn claims priority from U.S Provisional Patent Application No. 60/996,027, filed Oct. 25, 2007, U.S Provisional Patent Application No. 60/996,782, filed Dec. 5, 2007, U.S Provisional Patent Application No. 61/006,805, filed Jan. 31, 2008, U.S Provisional Patent Application No. 61/064,853, filed Mar. 31, 2008, U.S Provisional Patent Application No. 61/071,465, filed Apr. 30, 2008, U.S Provisional Patent Application No. 61/071,466, filed Apr. 30, 2008 and US Provisional Patent Application No. 61/129,608 filed Jul. 8, 2008, all of which are incorporated herein by reference in their entirety.

Other co-pending applications include: U.S. Provisional Application No. 60/960,207, filed Sep. 20, 2007 and entitled "Systems and Methods for Coupling Detection in Flash Memory", U.S. Provisional Application No. 61/071,467, filed Apr. 30, 2008 and entitled "Improved Systems and Methods for Determining Logical Values of Coupled Flash Memory Cells", U.S. Provisional Application No. 60/960,943, filed Oct. 22, 2007 and entitled "Systems and methods to reduce errors in Solid State Disks and Large Flash Devices" and U.S. Provisional Application No. 61/071,469, filed Apr. 30, 2008 and entitled "Systems and Methods for Averaging Error Rates in Non-Volatile Devices and Storage Systems", U.S. Provisional Application No. 61/006,120, filed Dec. 19, 2007 and entitled "Systems and Methods for Coping with Multi Stage Decoding in Flash Devices", U.S. Provisional Application No. 61/071,464, filed Apr. 30, 2008 and entitled "A Decoder Operative to Effect A Plurality of Decoding Stages Upon Flash Memory Data and Methods Useful in Conjunction Therewith", U.S. Provisional Application No. 61/006,385, filed. Jan. 10, 2008 and entitled "A System for Error Correction Encoder and Decoder Using the Lee Metric and Adapted to Work on Multi-Level Physical Media", U.S. Provisional Application No. 61/064,995, filed Apr. 8, 2008 and entitled "Systems and Methods for Error Correction and Decoding on Multi-Level Physical Media", U.S. Provisional Application No. 60/996,948, filed Dec. 12, 2007 and entitled "Low Power BCH/RS Decoding: a Low Power Chien-Search Implementation", U.S. Provisional Application No. 61/071,487, filed May 1, 2008 and entitled "Chien-Search System Employing a Clock-Gating Scheme to Save Power for Error Correction Decoder and other Applications", U.S. Provisional Application No. 61/071,468, filed Apr. 30, 2008 and entitled "A Low Power Chien-Search Based BCH/RS Recoding System for Flash Memory, Mobile Communications Devices and Other Applications", U.S. Provisional Application No. 61/006,806, filed Jan. 31, 2008 and entitled "Systems and Methods for using a Erasure Coding in Flash memory", U.S. Provisional Application No. 61/071,486, filed May 1, 2008 and entitled "Systems and Methods for Handling Immediate Data Errors in Flash Memory", U.S. Provisional Application No. 61/006,078, filed Dec. 18, 2007 and entitled "Systems and Methods for Multi Rate Coding in Multi Level Flash Devices", U.S. Provisional Application No. 61/064,923, filed Apr. 30, 2008 and entitled "Apparatus For Coding At A Plurality Of Rates In Multi-Level Flash Memory Systems, And Methods Useful In Conjunction Therewith", U.S. Provisional Application No. 61/064,760, filed Mar. 25, 2008 and entitled "Hardware efficient implementation of rounding in fixed-point arithmetic", U.S. Provisional Application No. 61/071,404, filed Apr. 28, 2008 and entitled "Apparatus and Methods for Hardware-Efficient Unbiased Rounding", U.S. Provisional Application No. 61/136,234, filed Aug. 20, 2008 and entitled "A Method Of Reprogramming A Non-Volatile Memory Device Without Performing An Erase Operation", U.S. Provisional Application No. 61/129,414, filed Jun. 25, 2008 and entitled "Improved Programming Speed in Flash Devices Using Adaptive Programming", and several other co-pending patent applications being filed concurrently (same day).

FIELD OF THE INVENTION

The present invention relates generally to error correction coding and more particularly to error correction coding of data to be stored in memory such as flash memory.

BACKGROUND OF THE INVENTION

The state of the art is believed to be represented by the following publications inter alia:
[1] "Interleaving policies for flash memory", United States Patent 20070168625
[2] "Minimization of FG-FG coupling in flash memory", U.S. Pat. No. 6,996,004
[3] Construction of Rate (n−1)/n Punctured Convolutional Code with Minimum Required SNR Criterion, Pil J. Lee, IEEE Trans. On Comm. Vol. 36, NO. 10, October 1988
[4] "Introduction to Coding Theory", Ron M. Roth, Cambridge University Press, 2006 5. U.S. Pat. Nos. 5,077,737; 6,781,910; 6,873,543; 6,891,768; 6,914,809; 6,961,890 to Smith; 6,990,012; 7,079,436; 7,149,950; and 7,191,379; Published US Applications 2004015771; 2005172179; 2007226592; and 2007171730; and Published PCT Application No. WO2006013529.
[5] Coded modulation to increase storage capacity of multi-level memories, Hui-Ling Lou; Sundberg, C.-E. Global Telecommunications Conference, 1998. GLOBECOM 98. The Bridge to Global Integration. IEEE Volume 6, Issue, 1998 Page(s):3379-3384 vol. 6
[6] On-chip error correcting techniques for new-generation flash memories, Gregori, S.; Cabrini, A.; Khouri, O.; Torelli, G., Proceedings of the IEEE, Volume 91, issue 4, April 2003 Page(s): 602-616
[7] Multi-level memory systems using error control codes, Hsie-Chia Chang; Chien-Ching Lin; Tien-Yuan Hsiao; Jieh-Tsorng Wu; Ta-Hui Wang, Circuits and Systems, 2004. ISCAS apos; 04. Proceedings of the 2004 International Symposium on Volume 2, Issue, 23-26 May 2004 Page(s): II-393-6 Vol. 2.
[8] Paulo Cappelletti, Clara Golla, Piero Olivo, Enrico Zanoni, "Flash Memories", Kluwer Academic Publishers, 1999
[9] G. Campardo, R. Micheloni, D. Novosel, "CLSI-Design of Non-Volatile Memories", Springer Berlin Heidelberg New York, 2005.

The disclosures of all publications and patent documents mentioned in the specification, and of the publications and patent documents cited therein directly or indirectly, are hereby incorporated by reference.

SUMMARY OF THE INVENTION

The following terms may be construed either in accordance with any definition thereof appearing in the prior art literature or in accordance with the specification, or as follows:

Bank=Device Back=memory Bank=Flash bank=Several Flash memory chips connected to the same controller and jointly providing a large amount of storage space.

Bit error rate (BER)=a parameter that a flash memory device manufacturer commits to vis a vis its customers, expressing the maximum proportion of wrongly read bits (wrongly read bits/total number of bits) that users of the flash memory device need to expect at any time during the stipulated lifetime of the flash memory device e.g. 10 years.

Block=a set of flash memory device cells which must, due to physical limitations of the flash memory device, be erased together. Also termed erase sector, erase block.

Cell: A component of flash memory that stores one bit of information (in single-level cell devices) or n bits of information (in a multi-level device having 2 exp n levels). Typically, each cell comprises a floating-gate transistor. n may or may not be an integer. "Multi-level" means that the physical levels in the cell are, to an acceptable level of certainty, statistically partitionable into multiple distinguishable regions, plus a region corresponding to zero, such that digital values each comprising multiple bits can be represented by the cell. In contrast, in single-level cells, the physical levels in the cell are assumed to be statistically partitionable into only two regions, one corresponding to zero and one other, non-zero region, such that only one bit can be represented by a single-level cell.

Charge level: the measured voltage of a cell which reflects its electric charge.

Coding Rate=Number of information bits/(Number of information bits+Redundancy bits).

Cycling: Repeatedly writing new data into flash memory cells and repeatedly erasing the cells between each two writing operations.

Decision regions: Regions extending between adjacent decision levels, e.g. if decision levels are 0, 2 and 4 volts respectively, the decision regions are under 0 V, 0 V-2 V, 2V-4 V, and over 4 V.

Demapping: basic cell-level reading function in which a digital n-tuple originally received from an outside application is derived from a physical value representing a physical state in the cell having a predetermined correspondence to the digital n-tuple.

Digital value or "logical value": n-tuple of bits represented by a cell in flash memory capable of generating 2 exp n distinguishable levels of a typically continuous physical value such as charge, where n may or may not be an integer.

Erase cycle: The relatively slow process of erasing a block of cells (erase sector), each block typically comprising more than one page, or, in certain non-flash memory devices, of erasing a single cell or the duration of so doing. An advantage of erasing cells collectively in blocks as in flash memory, rather than individually, is enhanced programming speed: Many cells and typically even many pages of cells are erased in a single erase cycle.

Erase-write cycle: The process of erasing a block of cells (erase sector), each block typically comprising a plurality of pages, and subsequently writing new data into at least some of them. The terms "program" and "write" are used herein generally interchangeably.

Flash memory: Non-volatile computer memory including cells that are erased block by block, each block typically comprising more than one page, but are written into and read from, page by page. Includes NOR-type flash memory, NAND-type flash memory, and PRAM, e.g. Samsung PRAM, inter alia, and flash memory devices with any suitable number of levels per cell, such as but not limited to 2, 4, or 8.

Low cycle-count flash device: A flash device in which space S is reserved for redundancy bytes sufficient in number to support decoding, at a predetermined level of accuracy, of original data stored at locations within the flash device which have been subjected to no more than a low number, c, of cycle counts. The number of redundancy bytes fitting into the space S is not sufficient to support decoding, at the predetermined level of accuracy, of original data stored at locations within the flash device which have been subjected to more than c cycle counts.

Mapping: basic cell-level writing function in which incoming digital n-tuple is mapped to a program level by inducing a program level in the cell, having a predetermined correspondence to the incoming logical value.

Page=A portion, typically 512 or 2048 or 4096 bytes in size, of a flash memory e.g. a NAND or NOR flash memory device. Writing can be performed page by page, as opposed to erasing which can be performed only erase sector by erase sector. A few bytes, typically 16-32 for every 512 data bytes are associated with each page (typically 16, 64 or 128 per page), for storage of error correction information. A typical block may include 32 512-byte pages or 64 2048-byte pages.

Precise read, soft read: Cell threshold voltages are read at a precision (number of bits) greater than the number of Mapping levels ($2^n$). The terms precise read or soft read are interchangeable. In contrast, in "hard read", cell threshold voltages are read at a precision (number of bits) smaller than the number of Mapping levels ($2^n$ where n=number of bits per cell).

Present level, Charge level: The amount of charge in the cell. The amount of charge currently existing in a cell, at the present time, as opposed to "program level", the amount of charge originally induced in the cell (i.e. at the end of programming).

Program: same as "write".

Program level (programmed level, programming level): amount of charge originally induced in a cell to represent a given logical value, as opposed to "present level".

Reprogrammability (Np): An aspect of flash memory quality. This is typically operationalized by a reprogrammability parameter, also termed herein "Np", denoting the number of times that a flash memory can be re-programmed (number of erase-write cycles that the device can withstand) before the level of errors is so high as to make an unacceptably high proportion of those errors irrecoverable given a predetermined amount of memory devoted to redundancy. Typically recoverability is investigated following a conventional aging simulation process which simulates or approximates the data degradation effect that a predetermined time period e.g. a 10 year period has on the flash memory device, in an attempt to accommodate for a period of up to 10 years between writing of data in flash memory and reading of the data therefrom.

Resolution: Number of levels in each cell, which in turn determines the number of bits the cell can store; typically a cell with $2^n$ levels stores n bits. Low resolution (partitioning the window, W, of physical values a cell can assume into a small rather than large number of levels per cell) provides high reliability.

Retention: original physical levels induced in the cells; retention is typically below 100% resulting in deterioration of original physical levels into present levels.

Retention time: The amount of time that data has been stored in a flash device, typically without, or substantially without, voltage having been supplied to the flash device i.e. the time which elapses between programming of a page and reading of the same page.

Symbol: Logical value

Threshold level: the voltage (e.g.) against which the charge level of a cell is measured. For example, a cell may be said to store a particular digital n-tuple D if the charge level or other physical level of the cell falls between two threshold values T.

Certain embodiments of the present invention seek to provide use of variable rate code, depending on the number of program/erase cycles, enabling compact storage when Flash device performs well.

Certain embodiments of the present invention seek to provide use of an additional bank of Flash devices to enable efficient encoding with variable code rates, beyond the allotted redundancy of the device.

Certain embodiments of the present invention seek to provide using a weighted cycle count, depending also on the time passage from the last burst of cycles, as determined by the number of errors counted during the last read.

Certain embodiments of the present invention seek to provide a cycle count indicator stored along with the data on a Flash e.g. with a single encoding/decoding block.

There is thus provided, in accordance with at least one embodiment of the present invention, a method for encoding information arriving from a host in order to store the coded information in flash memory, the method comprising encoding information arriving from a host for storage at a flash memory location including generating a number of redundancy bytes, the encoding proceeding at an encoding rate which is a function of the number of redundancy bytes generated, the encoding including determining an effective error rate, including an anticipated rate of expected reading errors, for the flash memory location; and selecting the encoding rate as a function of the effective error rate such that the number of redundancy bytes is sufficient to overcome the anticipated rate of expected reading errors with a predetermined degree of certainty.

Further in accordance with at least one embodiment of the present invention, the flash memory location comprises a page.

Still further in accordance with at least one embodiment of the present invention, determining comprises determining a rate of expected reading errors assuming reading occurs after a time period T, based on known data on frequency of errors when information is read from a flash memory which has undergone a simulation of effects of passage of the time period T.

Additionally in accordance with at least one embodiment of the present invention, determining comprises reading a stored effective error rate, identifying a time t at which the effective error rate was stored, and updating the effective error rate as a function of the stored effective error rate and the time, to take into account spontaneous recovery of the flash memory location, over time, from effects of some of the program cycles to which the flash memory location has been subjected.

Still further in accordance with at least one embodiment of the present invention, the updating comprises finding, for at least one stored number of program cycles to which the flash memory location was subjected at time t, a number of program cycles to which the flash memory location is subjected currently, after which the rate of errors currently read from the flash memory location equals the rate of errors currently read from the flash memory location which was subjected to the stored number of program cycles at time t.

Further in accordance with at least one embodiment of the present invention, the flash memory device comprises an NROM flash memory device.

Also provided, in accordance with at least one embodiment of the present invention, is a computer having an operating system, a storage unit comprising flash memory, and an operating system/storage unit interface providing interface between the storage unit and the operating system, the operating system being operative to query the storage unit to ascertain locations of bad flash memory portions, the interface including a bad location indicator operative to provide the operating system with an indication of the locations of bad flash memory portions, a flash memory controller operative to receive at least one of read commands, write commands, and status commands from a user, each command associated with a logical address, to translate each logical address into a physical address within the flash memory, and to translate the commands into at least one of read, erase and program instructions for the flash memory, and wherein the flash memory controller is operative to determine an encoding rate having fluctuations and accordingly and responsively to the querying, to declare as bad, at least one portion of the flash memory, which was previously devoted to original data and which, due to the fluctuations, is now devoted to redundancy bytes.

Further in accordance with at least one embodiment of the present invention, identifying a time t at which the effective error rate was stored, comprises associating a timer with the flash memory location, capable of generating a time stamp each time an operation is performed upon the flash memory location and storing at least one time stamp.

Further in accordance with at least one embodiment of the present invention, the operation comprises a flash memory location reading operation.

Still further in accordance with at least one embodiment of the present invention, identifying a time t at which the effective error rate was stored comprises reading the flash memory location including quantifying and correcting errors encountered, and estimating the time of last programming as a function of the quantification of errors encountered.

Additionally in accordance with at least one embodiment of the present invention, the effective error rate for an individual flash memory location is stored adjacent the individual flash memory location.

Further in accordance with at least one embodiment of the present invention, the flash memory location comprises a page and the effective error rate for the page is stored within the page.

Further in accordance with at least one embodiment of the present invention, the effective error rate is encoded at a fixed coding rate corresponding to a fixed number of redundancy bytes which is high enough to overcome expected corruptions of the effective error rate.

Still further in accordance with at least one embodiment of the present invention, the encoding, determining and selecting are performed for a plurality of flash memory locations.

Also provided, in accordance with at least one embodiment of the present invention, is high cycle count flash memory apparatus having a cycle count C, the apparatus comprising a set of flash memory devices including at least one low cycle-count flash device having a cycle count $c<C$ storing original data elements, at least one additional flash device sufficient in size to store redundancy bytes sufficient in number to ensure that if information is encoded into the set of flash devices, with redundancy, thereby to generate a set of redundancy bytes, the additional flash device is sufficiently large to store a set of redundancy bytes sufficiently large to enable the information to be decoded at least a predetermined level of accuracy; and apparatus for reading at least one original data element from the low cycle flash memory device, and, in parallel, for reading at least one redundancy byte generated in the course of encoding the original data element, from the additional flash device.

Further in accordance with at least one embodiment of the present invention, the set of flash memory devices includes more than one flash device and the at least one additional flash device stores redundancy bytes for the more than one flash device.

Any suitable processor, display and input means may be used to process, display, store and accept information, including computer programs, in accordance with some or all of the teachings of the present invention, such as but not limited to a conventional personal computer processor, workstation or other programmable device or computer or electronic computing device, either general-purpose or specifically constructed, for processing; a display screen and/or printer and/or speaker for displaying; machine-readable memory such as optical disks, CDROMs, magnetic-optical discs or other discs; RAMs, ROMs, EPROMs, EEPROMs, magnetic or optical or other cards, for storing, and keyboard or mouse for accepting. The term "process" as used above is intended to include any type of computation or manipulation or transformation of data represented as physical, e.g. electronic, phenomena which may occur or reside e.g. within registers and/or memories of a computer.

The above devices may communicate via any conventional wired or wireless digital communication means, e.g. via a wired or cellular telephone network or a computer network such as the Internet.

The apparatus of the present invention may include, according to certain embodiments of the invention, machine readable memory containing or otherwise storing a program of instructions which, when executed by the machine, implements some or all of the apparatus, methods, features and functionalities of the invention shown and described herein. Alternatively or in addition, the apparatus of the present invention may include, according to certain embodiments of the invention, a program as above which may be written in any conventional programming language, and optionally a machine for executing the program such as but not limited to a general purpose computer which may optionally be configured or activated in accordance with the teachings of the present invention.

A detailed description of the embodiments referred to above, and other embodiments, follows.

Any trademark occurring in the text or drawings is the property of its owner and occurs herein merely to explain or illustrate one example of how an embodiment of the invention may be implemented.

Unless specifically stated otherwise, as apparent from the following discussions, it is appreciated that throughout the specification discussions, utilizing terms such as, "processing", "computing", "estimating", "selecting", "ranking", "grading", "calculating", "determining", "generating", "reassessing", "classifying", "generating", "producing", "stereo-matching", "registering", "detecting", "associating", "superimposing", "obtaining" or the like, refer to the action and/or processes of a computer or computing system, or processor or similar electronic computing device, that manipulate and/or transform data represented as physical, such as electronic, quantities within the computing system's registers and/or memories, into other data similarly represented as physical quantities within the computing system's memories, registers or other such information storage, transmission or display devices.

BRIEF DESCRIPTION OF THE DRAWINGS

FIG. 3A is a diagram of the Flash device array of FIG. 1, constructed and operative in accordance with a first embodiment of the present invention;

FIG. 3B is a diagram of the Flash device array of FIG. 1, constructed and operative in accordance with a second embodiment of the present invention;

FIG. 5A is a diagram of a page mapping scheme which is effected subsequent to an encoding process which uses a low rate, i.e. with large redundancy blocks, in accordance with certain embodiments of the present invention;

FIG. 5B is a diagram of a page mapping scheme which is effected subsequent to an encoding process which uses a high rate, i.e. with small redundancy blocks, in accordance with certain embodiments of the present invention;

FIG. 11 is an example of a Physical Block Usage table, filled with example data, which may be used by the memory management unit of FIG. 9 in accordance with certain embodiments of the present invention;

FIG. 12 is an example of a logical page lookup table, filled with example data, which may be used by the memory management unit of FIG. 9 in accordance with certain embodiments of the present invention;

DETAILED DESCRIPTION OF CERTAIN EMBODIMENTS

Figure 1:
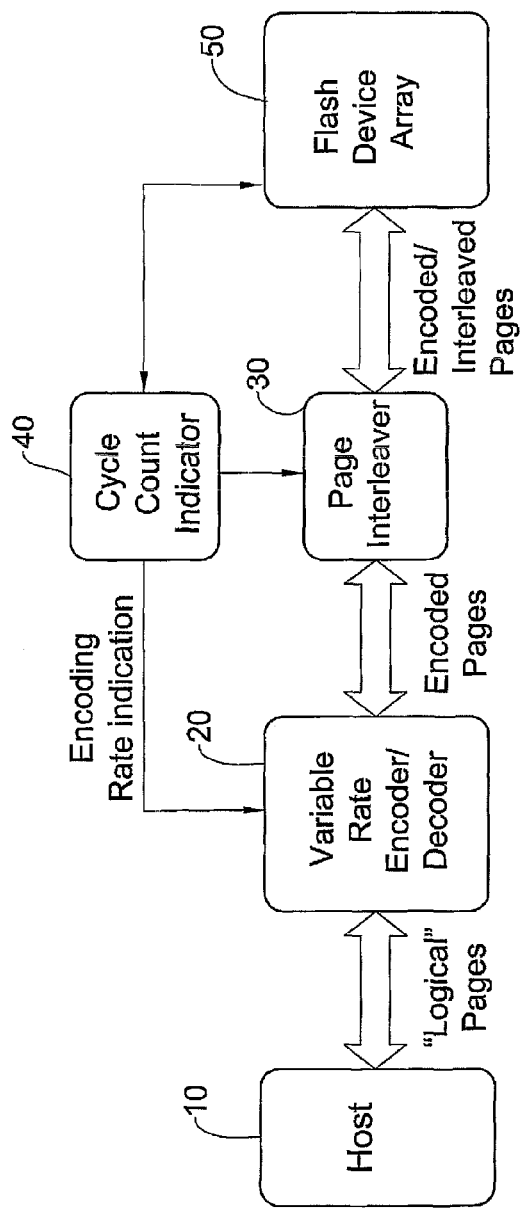
FIG. 1 is a simplified functional block diagram illustration of a system which varies the encoding rate, e.g. the amount of redundancy added, according to the number of cycles in an erase block, all constructed and operative in accordance with certain embodiments of the present invention.

Today's Flash memory devices store information with a high density of Flash cells with ever smaller dimensions. In addition, Multi-Layer Cells (MLC) store several bits per cell by setting the amount of charge in the cell. The amount of charge is then measured by a detector, as measured by a threshold voltage of the transistor gate. Due to inaccuracies during the programming procedure and charge loss due to time and temperature (also known as retention), the measured levels during a Read operation suffer from detection errors. The small dimensions of the Flash cells result in cells that can store very small amounts of charge, enhancing the effects of inaccuracies due to programming and retention. Thus, new single layer cells (SLC) and multi-level cell devices have significantly increased bit error rate (BER), decreasing the reliability of the device.

Flash devices are organized into (physical) pages. Each page comprises a section allocated for data (512 bytes-4 Kbytes) and a small amount of bytes (16-32 bytes for every 512 data bytes) comprising redundancy and back pointers. The redundancy bytes are used to store error correcting information, for correcting errors which may have occurred e.g. during the page Read. Each Read and Program operation is performed on an entire page. A number of pages are grouped together to form an Erase Block (EB). A page cannot be erased unless the entire erase block which comprises it is erased.

An important measure of a Flash device quality is the number of times (Np) it may be reprogrammed before irrecoverable errors occur. The higher the number of program-erase cycles, the higher the bit error rate. Thus, today's multi-level cell devices can perform around Np=1000 cycles or less before the allocation of 16-32 bytes of redundancy per 512 bytes of data bytes becomes insufficient to correct errors. Single-level cell devices usually perform better but obtain a much lower density, and hence their prices are much higher. Note that following Np program-erase cycles the device is still operational but the bit error rate is higher. Furthermore, in many devices (e.g. NROM Flash devices), this behavior is predictable and it can be shown that the number of redundancy bytes required to correct these errors does not jump rapidly.

One application of Flash devices is solid state disks (SSD) where an array of Flash devices is used as the storage media of a computer hard drive, thus enjoying the fast Read and Access times of Flash chips. In a solid state disk (SSD), several Flash chips are programmed and read simultaneously to increase the Read and Program speeds. For this purpose, solid state disks are arranged into multiple "Banks" that allow parallel read/write operations, each Bank typically comprising a number of Flash devices. The Read/Program performance may be multiplied by the number of Banks, compared with a single Flash chip, as is evident from Reference [1].

Certain embodiments of the present invention provide for encoding with variable redundancy length, depending on the number of Program/Erase cycles (Np) which have occurred in an erase block. For this purpose, an additional Bank of Flash devices may be added which contains additional space for redundancy and data, beyond that allotted in the Flash pages. Thus, the additional redundancy may facilitate correction of a greater number of errors than is conventional, thereby to provide for a significantly higher number of Program/Erase cycles than is conventional and/or than was originally designed. As the additional Bank is read and programmed in parallel with the other banks, the performance hit is small. Furthermore, as only a small proportion of memory banks is typically added to the existing number of banks, such as for example 1 bank per every 4 banks, the added cost may be much smaller than the cost of replacing multi-level cell with single-level cell devices to increase reliability. In applications or environments where Np is small and no additional redundancy is required, the added bank may be used for data.

FIG. 1 illustrates a system which varies the encoding rate, e.g. the amount of redundancy added, according to the number of cycles in an erase block. If a program operation is initiated by a host 10, the processing of the data may be as follows:

a. The Host 10 sends "logical" pages to be programmed on the Flash array 50. The host may comprise a computer such as a personal computer, or an SD card-employing application. b. A Variable Rate Encoder/Decoder 20 encodes the logical pages and adds redundancy e.g. as per the example described in detail below. The amount of redundancy added may for example depend on the rate indication obtained by a Cycle count indicator 40.

c. A Page Interleaver 30 receives a sequence of, say, L encoded pages and simultaneously programs them into the Flash array.

d. The Cycle Count Indicator 40 reads the number of cycles that the erase block has gone through from the flash array and determines, e.g. as per the example described in detail below, an appropriate encoding rate. The cycle count may be stored in the erase block on some of the redundancy bytes of some of the pages in the erase block. Indicator 40 typically also knows how to program the cycle count following erasure of the block and programming of the block's first page.

A read operation may be performed analogously, with the operations reversed.

Variable Rate Encoder/Decoder 20 performs variable rate encoding and decoding operations according to the rate indication provided by the Cycle Count Indicator 40. Any suitable method may be employed for varying rate of the code, such as but not limited to the following:

1. Conventional codes for Flash devices include algebraic codes such as Reed Solomon or BCH e.g. as described in Reference [4]. A suitable method for changing the rate of such a code is to change the length of the data being encoded/decoded while maintaining constant redundancy.

For example, consider a binary BCH code designed for a 2 Kbyte page with a redundancy of 128 bytes. Such a code may be used on some of today's devices with standard redundancy. To code with twice the redundancy, code two IKbyte-batches and add to each a redundancy of 128 bytes. Thus, overall, redundancy of 256 bytes is provided for every 2 Kbytes of data. This approximately doubles the possible magnitude of the input bit error rate. Similarly, the redundancy may be quadrupled by coding over batches of 512 bytes.

Figure 2:
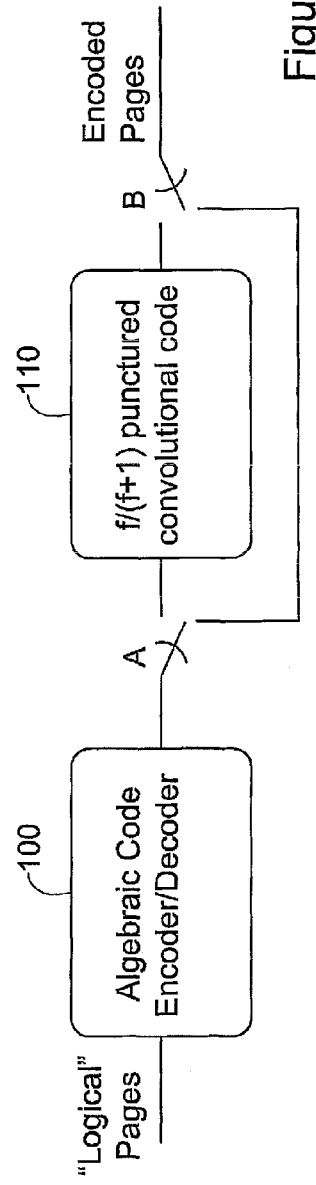
FIG. 2 is a simplified functional block diagram illustration of the encoder/decoder of FIG. 1, constructed and operative in accordance with certain embodiments of the present invention.

2. It may sometimes be more efficient, although less compact, to add an inner convolutional code with several puncturing options and use an Algebraic code as an outer code. The algebraic code may be a standard one such as RS or BCH codes. The inner code may be a convolutional code whose puncturing rate may be a parameter of the code e.g. as described in Reference [3]. FIG. 2 is an example of this type of encoder/decoder. If the initial rate (i.e. the rate derived by the redundancy inherently allotted in each Flash device per page) is used, switches A and B are set to bypass the convolutional encoder/decoder and only the algebraic code may be operative. If lower rates are employed, the parameter f is set according to the cycle count e.g. as described below, and the convolutional code may be used.

For example, consider an outer encoder using a binary BCH code designed for a 2 Kbyte page with a redundancy of 128 bytes. By setting f=4, the convolutional encoder may yield a rate of 4/5 and the overall redundancy may be 640 bytes. 128 bytes may be stored with the data on the same page and the other 512 bytes may be stored separately. By setting a rate of 8/9 is obtained and the overall redundancy is 384 bytes.

3. An additional option is to build a set of encoders/decoder, each designed for a specific rate. This option may be least compact but may assure the most effective use of the redundancy bytes.

Page Interleaver 30 receives a sequence of encoded pages and programs them simultaneously onto the Flash array 50. For example, consider a flash array with 5 Banks of Flash devices and assume that the variable code rate is set to 4/5. The host may simultaneously send 4 logical pages which may be encoded at a rate of 4/5 and stored simultaneously over the 5 memory banks, one page per bank. Allocation of banks to data or redundancy may be done in one of several ways such as but not limited to the following:

a. The data+redundancy may be stored sequentially over the banks. For example, FIG. 3A is a diagram of a Flash array with 5 banks. In each bank a single page may be used. Following encoding at a rate of 4/5, the first bank contains part of the first encoded page. The second bank contains the remainder of the first page and the beginning of the second encoded page, and so on; the remaining encoded pages are distributed over the banks as shown.

b. The data of each logical page is associated with its own bank and the additional redundancy of all encoded pages is stored in a designated bank. For example, FIG. 3B is a diagram of a Flash array with 5 banks. Banks 1 through 4 store the data and some partial redundancy of the respective encoded pages. Bank 5 contains the rest of the redundancies of each of the encoded pages.

The interleaver 30 of FIG. 1 may additionally be operative to determine the correct page address, bank, and device within a bank, when a read or program operation is performed.

If a constant rate is used, one-to-one addressing is able to translate each "logical" address to a "physical" address. However, if variable rate codes are used, it may be desired to utilize unused memory locations when the redundancy is small. FIG. 5A illustrates a page mapping which is effected subsequent to an encoding process which uses a low rate, i.e. with large redundancy blocks. In contrast, FIG. 5B illustrates a page mapping which is effected subsequent to an encoding process which uses a high rate, i.e. with small redundancy blocks. The compacting of the pages in FIG. 5B creates a page mapping problem between the logical address and its actual address. To overcome the mapping problem, a back pointer may be associated with each page or set of pages (e.g. erase block), which maps the page or set to its logical address. This back pointer may be stored during a program operation as part of the redundancy. Then, during a read or program operation, the interleaver 30 may scan the array 50 to determine the actual address.

Figure 4:
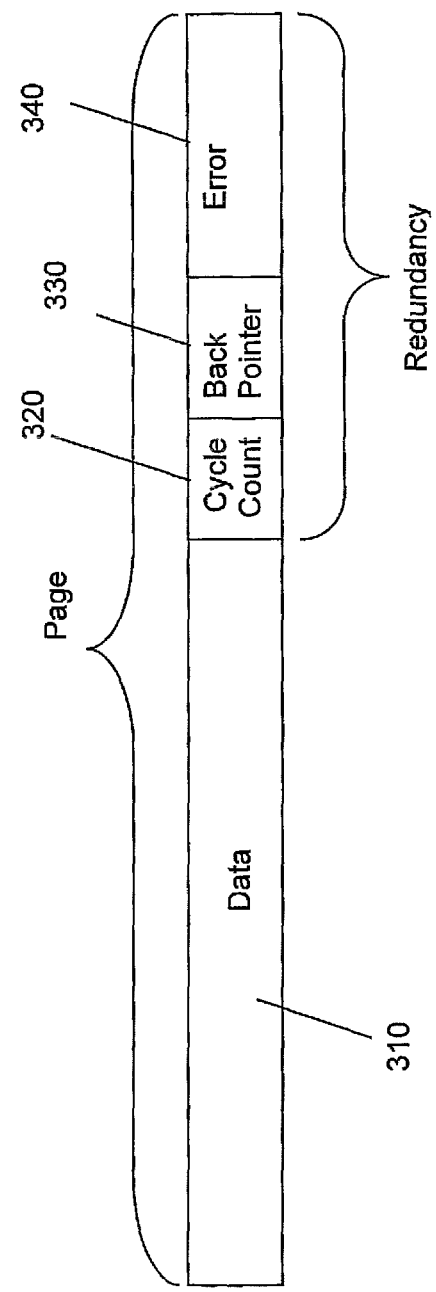
FIG. 4 is a diagram of a page comprising both a back pointer and a cycle count indicator which may be stored as part of the redundancy of the page, along with error correction information, all in accordance with certain embodiments of the present invention.

Alternatively, the interleaver 30 may read the entire array 50 and fill a table mapping the logical addresses to physical addresses during the initialization of the system. FIG. 4 is a diagram of a page comprising both a back pointer 330 and a cycle count indicator 320 which may be stored as part of the redundancy of the page, along with the actual error correction information 340. The cycle count indicator 320 (Np) may optionally be used to determine the encoder rate during the next programming cycle and the rate during a decoding procedure, in which case, the cycle count may be encoded separately, as described in detail below.

According to certain embodiments of the present invention, as the cycles occur at the erase block level rather than at the individual page level. it may be more efficient to store the cycle counter only once per erase block instead of once per page. If so, a specific location within the erase block may be allocated to store the cycle count (Np) for the entire block. Similarly, as the cycle count affects the encoding rate of the entire block, only one back pointer may be stored for an entire block. For example, a back pointer to the first page in the block may be stored, and no back pointers for any of the remaining pages may be stored; instead, the other pages may be counted out sequentially starting from the back pointer of the first page.

Another result of allowing high rate pages to be compacted over the banks as shown in FIG. 5B may be that as the Flash array is cycled, the encoding may use lower rates and hence, more space may be used, such that the space available in the flash array 50 for actual data may become smaller in time. This may result in addressing problems. For example, at the beginning of life two (say) logical pages may be programmed to the array, first written to the lowest logical address available and the last to the highest logical address. As time progresses, the pages in between the 2 logical addresses are cycled and are programmed with lower rates, hence employing more space, such that it may no longer be possible to program all the addresses that were available at the beginning. To accommodate this possibility, some logical addresses in the array 50 may be marked as "bad blocks" or "unavailable blocks"; to alert the host 10, typically via a suitable controller, that these addresses are not to be used. Alternatively, some pages may be falsely marked as occupied although in fact they contain no data.

For compactness and simplicity, an address space which is believed to be typical at end of life may be pre-designated.

The Cycle Count Indicator 40 reads the cycle count field of an individual Erase Block or page and determines the encoding/decoding rate for the encoder 20 and for the interleaver 30. Cycle Count Indicator 40 also determines the number of cycles to be programmed next.

Any suitable scheme may be employed to store the cycles count indicator (Np), such as but not limited to the following:

a. The cycle count indicator 40 may not be encoded along with the data and instead may be encoded separately typically using its own code e.g. a short BCH code, thereby to allow the decoding rate to be determined before reading the page.

b. The cycle count indicator 40 may be encoded with the data using the same encoder/decoder, during the read operation. A suitable encoding technique for this purpose is, for example, the selectably-puncturable inner convolutional code/outer algebraic coding technique described above. The outer, algebraic code may use a short redundancy which fits the data in one page in the Flash device e.g. as per the example described in detail below. The remaining redundancy, which is due to the inner convolution code, may be stored separately. For high rate coding only the outer (algebraic) code may be used whereas for lower rates coding, both the inner and outer codes may be used. The decoding may be performed first based solely on the algebraic code. If the decoding is unsuccessful, the read operation may be repeated with reliance on the inner decoder as well. Whereas this technique may be time consuming for high cycle counts (Np), no additional special encoder may be needed for the cycle count indicator.

Normally, the cycle count for each time an erase block is programmed, is simply an increment of the previous count. However, Flash memory devices, with time, tend to "forget" the number of cycles and improve their bit error rate performance following retention. For example, a Flash which underwent 1000 program/erase cycles within a period of one week may suffer a noticeable deterioration in bit error rate performance following retention. However, a Flash device that underwent 999 program/Erase cycles and only a year later underwent its 1000th cycle may exhibit better bit error rate performance, following additional retention, as compared to the previous flash device which underwent all 1000 cycles in the first week. The time passage from the previous erase block erasure can be estimated on a basis of the cycle counts and the number of errors which occurred during the latest read operation of the oldest page in the erase block. The cycle count (Np) can therefore be set to a lower value if the number of errors is not large, e.g. as per the example described below, thus enabling a higher rate encoding and more compact storage. A cycle counter so programmed is termed below a "weighted" cycle count or "weighted" cycle count indicator.

Weighted cycle count is a parameter characterizing a memory portion such as an erase block which is typically an increasing function of the number of erase-write cycles that memory portion has undergone, and an increasing function of the effective duration of time the memory portion had available to recover from erase-write cycles it has undergone, where the effective duration of time is a function of the length of the time period the memory portion had available to recover from erase-write cycles it has undergone (also termed retirement) and the temperature of the memory portion during that time period.

Computation of the weighted cycle count following a certain period of retirement may or may not be based upon a physical model of the Flash memory device. In [1] N. Mielke, H. Belgal, I. Kalastrisky, P. Kalavade, A. Kurtz, Q. Meng, N. Righos, and J. Wu, "Flash EEPROM Threshold Instabilities due to Charge Trapping During Program/Erase Cycling", IEEE Trans. On Device and Materials Reliability, Vol. 4, No. 3, September 2004, the authors propose a model where the fraction of traps which disappear at room temperature during time Tr is given by $\propto \cdot \log(T_r)$ for some constant trap dissipation rate which depends on the Flash technology being used and the temperature. Therefore, according to some embodiments of the present invention, as the traps are the main contributors for endurance degradation with cycling and retention (at technologies of <100 nm), the disappearance of traps may be represented by effectively decreasing the weighted cycle count.

In the same paper the authors show that the number of traps grows approximately as the square root of the number of cycles. Therefore, according to some embodiments of the present invention, an effective number of cycles may be approximated by: $C_s \cdot (1 - \propto \cdot \log(T_r))^2$ where Cs is the previous weighted cycle count.

Figure 6:
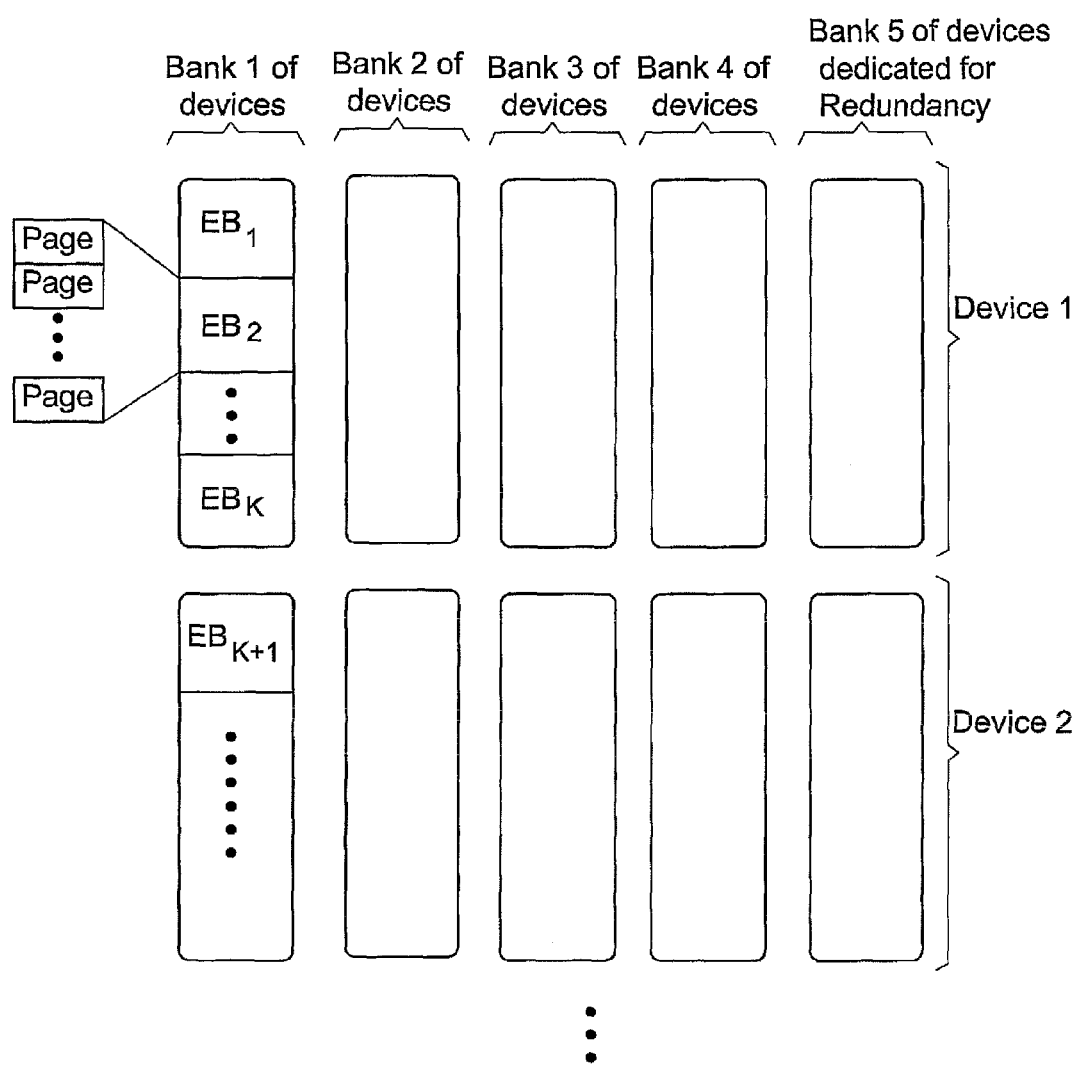
FIG. 6 is a diagram of the Flash device array of FIG. 1, constructed and operative in accordance with certain embodiments of the present invention.

Flash array 50, as shown in FIG. 6, typically comprises L+1 banks of Flash memory devices of which L banks are allocated for data and Bank L+1 is allocated for redundancy. Each Bank comprises M Flash memory devices. Each memory device comprises K Erase Blocks and each Erase Block comprises T pages. At each bank, the erase blocks are numbered serially from 1 to MK. In each erase block, the pages are numbered from 1 to T, resetting at the beginning of each erase block.

An example of how the usage of code may be modified to accommodate different rates and hence, handling different bit error rates (BERs), is now described. An algebraic BCH code is designed over the field GF(213), as described in Reference [4], to correct 24 errors. Such a code typically employs 39 bytes of redundancy. This code may be employed to encode data with lengths (L) between 1 bytes and 984 bytes. The rate is determined by the ratio r=L/(L+39). The shorter the data length, the higher the bit error rate that the code can handle. In this example, the length of the logical page is 2048 bytes. Three strategies for using the above code are now described:

1. Encode 2048 bytes of data__+11 bytes provided for additional information such as cycle count, and add 39*3=117 bytes. To do this, divide the 2048+11 bytes into 3 consecutive sections of 686,686 and 687 bytes. Encode each section separately, thereby to generate 39 bytes of redundancy per section, for a total of 2048+128=2176 bytes. This code can handle bit error rate of 6.5E-4 and at its output produces a bit error rate of 1E-15.

2. Encode 2048 bytes of data__+11 bytes and add 20*39 bytes. This may be effected by dividing the 2048+11 bytes into 20 consecutive sections, the first 19 having 103 bytes and the last one having 102 bytes. Encode each section separately, thereby to generate 39 bytes of redundancy, for a total of 2839 bytes. This code can handle a bit error rate of 3E-3 and at its output produces a bit error rate of 1E-15.

3. Encode 2048 bytes of data__+11 bytes and add 58*39 bytes. This may be effected by dividing the 2048+11 bytes into 58 consecutive sections, the even sections having 35 bytes and the odd sections having 36 bytes. Encode each section separately, thereby to generate 39 bytes of redundancy, for a total of 4321 bytes. This code can handle bit error rate of 5.5E-3 and at its output produces a bit error rate of 1E-15.

Figure 7:
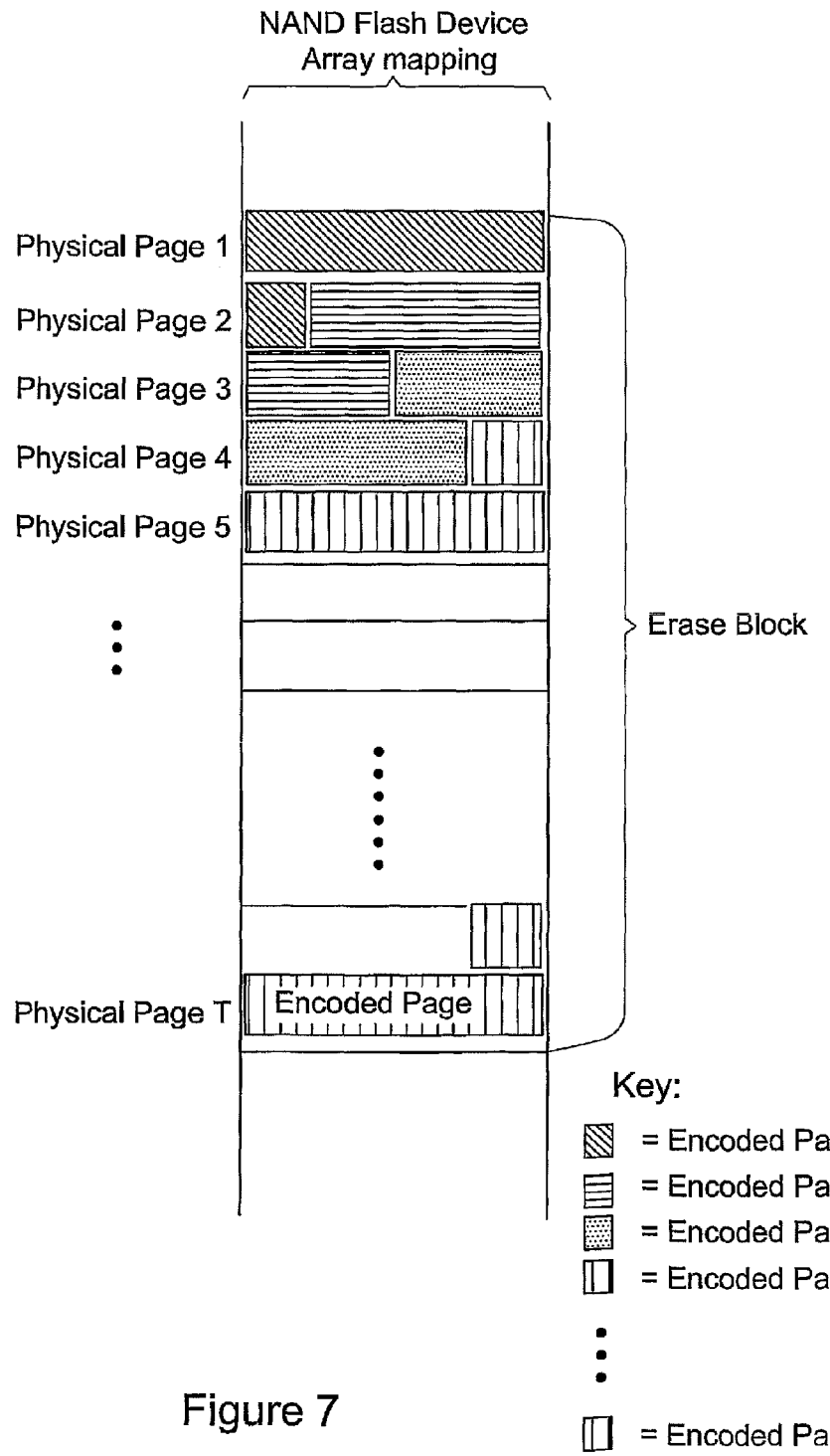
FIG. 7 is a diagram of one possible page mapping scheme which is suitable for the embodiment of FIG. 8.
Figure 8:
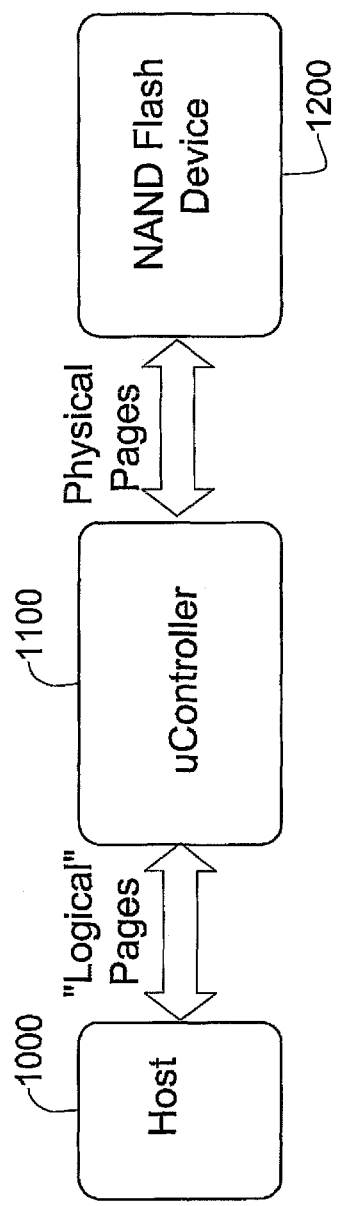
FIG. 8 is a simplified functional block diagram illustration of a variable rate system including a single NAND Flash device 1200 in accordance with certain embodiments of the present invention.
Figure 10:
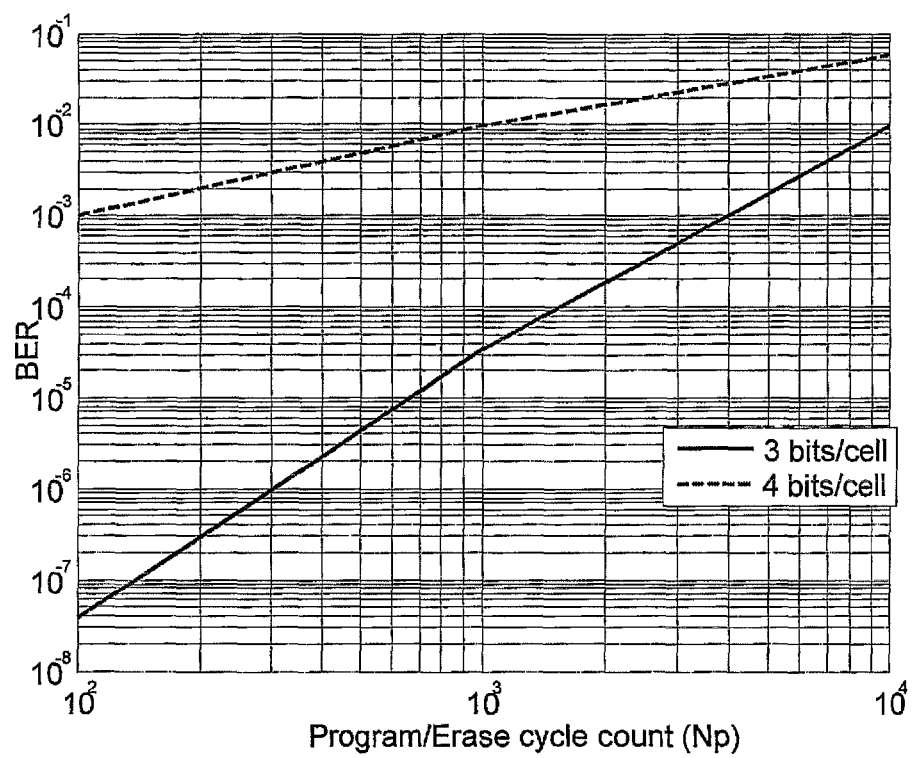
FIG. 10 is a bit error rate vs. cycle count graph useful in accordance with certain embodiments of the present invention.

FIG. 10 shows an example of how the bit error rates may change as a function of the program erase cycles in a NAND flash device employing 3 bits/cell. It can be seen from the graph of FIG. 10 that for 3 bits/cell specifically, the first strategy may be employed up to Np=3000, followed by the second strategy until Np=5000 and above Np=5000 the third strategy may be employed. An alternative is to switch between the 4 bit/cell configuration and the 3 bit/cell configuration depending on the cycle count. FIG. 8 illustrates a variable rate system including a single NAND Flash device 1200 in accordance with certain embodiments of the present invention. In this system, logical pages may accommodate more than a single physical page as shown in FIG. 7. The system of FIG. 8 typically comprises a uController (1100), a NAND Flash device (1200) and a Host (1000). The system may realize an application such as a USB drive or an SD card; the Host 1000 would then be a PC or an application using SD cards such as a digital camera or an MP3. The Host 1000 sends Read/Write commands to the uController 1100 which translates these read/Write commands to read/program/erase commands on the Flash device 1200. The communication between the host 1000 and uController 1100 may occur through standard protocols such as the SD standard or the USB protocol.

Figure 9:
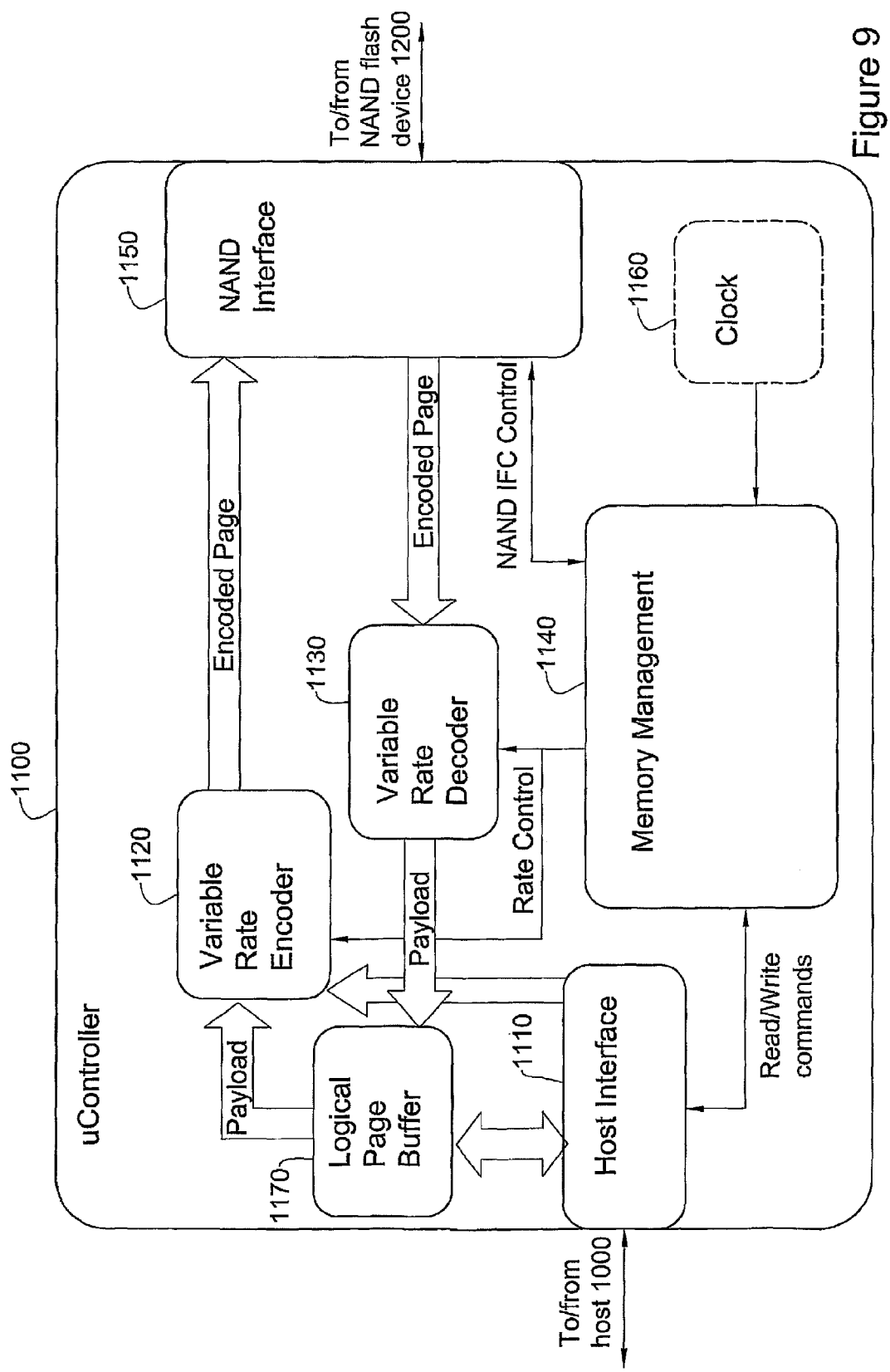
FIG. 9 is a simplified functional block diagram illustration of the uController of FIG. 8, in accordance with certain embodiments of the present invention.

FIG. 9 is a simplified functional block diagram illustration of the uController 1100 of FIG. 8, in accordance with certain embodiments of the present invention. As shown, the uController 1100 comprises an Encoder 1120 and Decoder 1130. Typically, each of these can encode at various selectable rates, e.g. as described above, to produce different amounts of redundancy. A host interface 1110 receives the commands from the host 1000 and responds thereto. The host interface 1110 typically comprises a buffer that stores a logical page to be programmed.

The pages sent by the host 1000 may be smaller than the data length used by the encoder 1120 in which case the host interface 1110 translates the data sizes to those used by encoder 1120. For example, the encoder 1120 may use a constant size of 2048 bytes of data whereas the interface with the host 1000 may occur in chunks of 512 bytes. The interface 1110 may serialize 4 chunks of 512 bytes to obtain the 2048 bytes. If this is not possible, e.g. if not enough chunks have arrived, then the interface 1110 may append to the available chunks, a sequence of zeroes, until a full page of 2048 bytes is obtained.

The NAND interface 1150 connects to the NAND flash 1200 and is operative to send suitable program/erase and read commands to the NAND flash 1200. The NAND interface 1150 typically comprises a program buffer (not shown) the size of a page (say 2048+128 bytes). Each time the program buffer is full, a program command is initiated to a physical page location, previously sent to the NAND interface 1150.

A payload logical page buffer 1170 is typically provided to temporarily hold the data to be programmed. A memory management unit 1140 interfaces with the host interface 1110, the variable rate decoder 1130 and, optionally, with a clock 1160, all as described in detail below. The optional clock (1160) stores time stamps and is provided in those embodiments which utilize effective cycle counts rather than raw cycle counts.

Memory management unit 1140 is operative to translate between the logical page addresses as perceived by the host 1000, to physical page addresses stored on the NAND flash 1200. Memory management unit 1140 handles the different rates used by the system, typically using two tables, examples of which are illustrated in FIGS. 11 and 12 respectively. These tables are now described:

The Physical Block Usage table (e.g. as in FIG. 11) is a lookup table that associates some or all of the following information items (columns in FIG. 11) with each erase block (row in FIG. 11) in the flash device 1200:

a cycle count (Np), a number of logical pages that the erase block can store. This parameter, which is also termed herein "#PagesPerBlock" typically depends on the Cycle count Np and determines rates at which the encoder operates in order to create an encoded page, and a number of logical pages which are actually allocated to this erase block. Optionally, we may also store a time stamp indicating when the block was last programmed.

The logical page lookup table, e.g. as in FIG. 12, is a lookup table that stores, for each set of, say, 32 logical addresses, some or all of the following information items:

Bloc#: an erase block in the flash array 1200 which has been allocated to store these addresses FirstPage#: a logical page within the block on which the first address in this set is stored, and OccupyVec: a vector of, say, 32 bits indicating which pages have already been programmed and which pages have not. In the illustrated example, 1=programmed, 0=empty.

The size of the set of logical addresses may be the largest common divisor of possible values of #PagesPerBlock stored in the physical block usage table of FIG. 11. For example, if the table of FIG. 11 indicates that there are blocks storing 128, 96 and 64 logical pages then the set of logical addresses may include 32 logical addresses.

The illustrated embodiment and example data are based on the 3-rate algebraic code described above and assume that the Flash array 1200 includes Erase blocks, each comprising 128 physical pages, each including 2048+128 bytes. It is also assumed that the data payload comprises 2048 bytes received from the host 1000 and 11 bytes for cycle counts and back pointers as described above. The rate selected for the encoder 1120 and decoder 1130 depends on the cycles count as described above. Thus, a block may comprise 128, 96 or 64 logical pages, using rate 1, 2 or 3.

If a Block comprises 96 logical pages, each set of 32 logical pages is assumed, in the illustrated example, to be programmed into a set of 42 physical pages such that logical pages 0-31 are mapped to physical pages 0-41, logical pages 32-63 are mapped to physical pages 42-83 and logical pages 64-95 are mapped to physical pages 84-125. If there are 64 logical pages per block, each logical page is mapped to two different physical pages.

Each entry in the Logical page lookup table of FIG. 12 comprises a reference to a set of 32 logical pages. Thus, in order to locate the location of a logical page, the methods of FIGS. 13 and 14 may be followed. FIG. 15 is, then, a suitable "read logical page" operation which may be performed by the uController 1100 of FIG. 8. Regarding a "write logical page" operation, if a logical page was previously programmed, it cannot be replaced without first erasing the physical block which contains it. Also, logical pages are now encoded over several physical pages. Hence, even if a target logical page has not been programmed, an adjacent logical page may have been programmed, in which case it may not be possible to program the target page because it may be partially located on the same physical page allocated to another programmed page. To overcome this problem a block copy and modify operation, e.g. as shown in FIGS. 16A-16D, may be performed, followed by a write operation e.g. as shown in FIG. 17.

It is appreciated that each of the methods shown in the various simplified flowchart illustrations provided herein may include some or all of the steps actually shown, suitably ordered e.g. as shown.

In the illustrated embodiment, logical pages have a uniform, predetermined length. However, due to the variable code rate, each erase block is able to store a different number of logical pages. In the illustrated embodiment, 3 example strategies (not intended to be limiting) are employed, as described above, and the number of logical pages which each erase block is to store is determined as a function of the strategy. In the example described herein, the code rates are such that 128, 96 and 64 logical pages are stored per erase block. Therefore, for example, the number of bytes used to store each logical page when strategy 2 is used, is 2839, as may be seen, e.g. in step 1350 of FIG. 13. The numbers of bytes used to store each logical page when strategies 1 and 3 are used are each of course different. In strategy 1, each physical page stores exactly one logical page in the illustrated example. In strategy 3, each logical page is stored over exactly two physical pages as is evident e.g. from step 1385 in FIG. 13.

Figure 14:
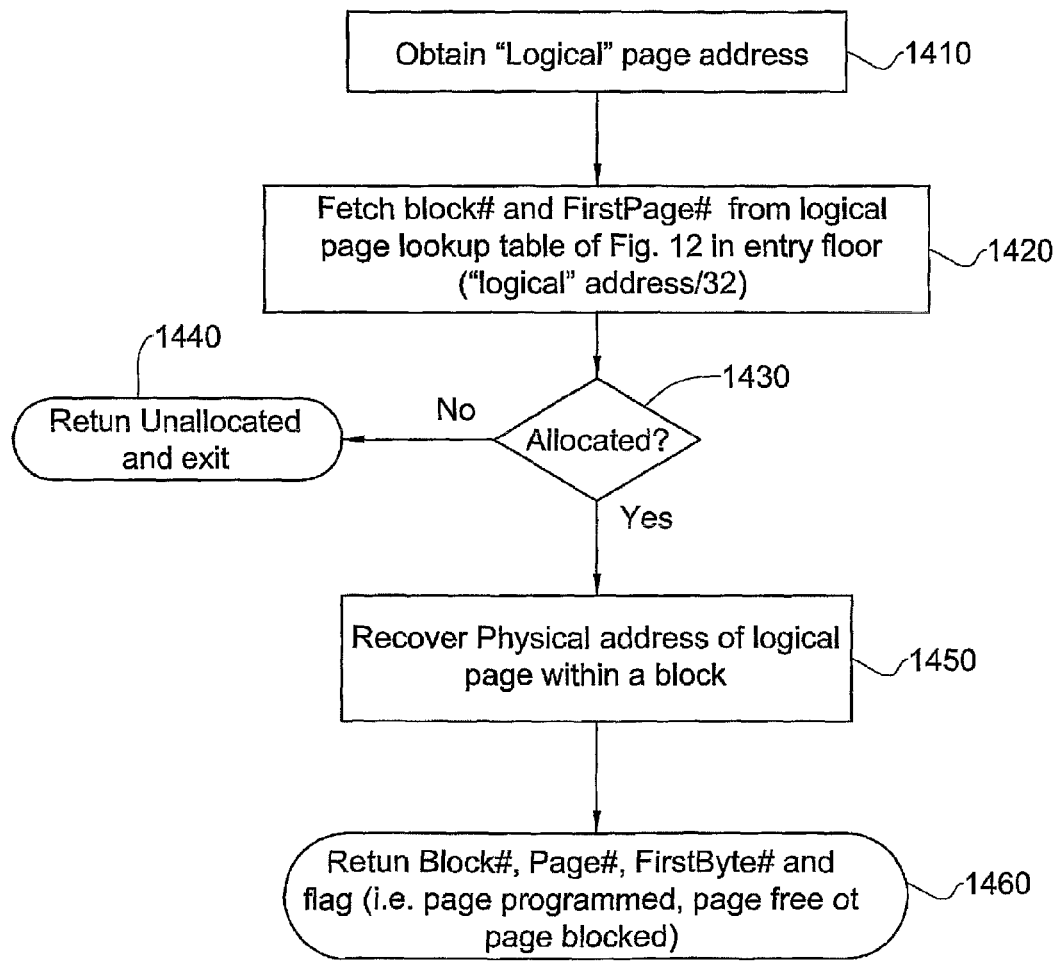
Figure 15:
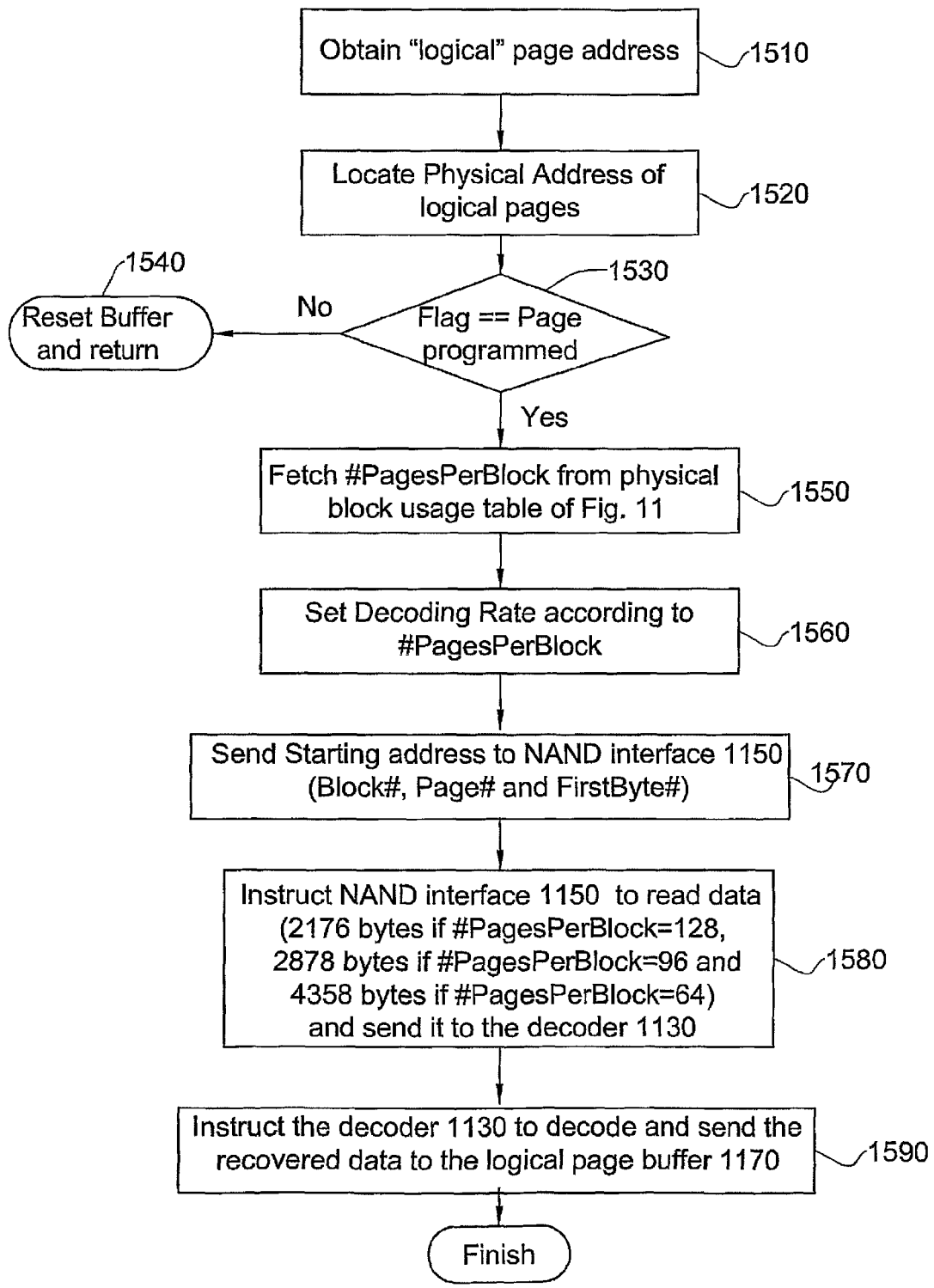
FIG. 15 is a simplified flowchart illustration of a "read logical page" method which may be performed by the uController 1100 of FIG. 8, in accordance with certain embodiments of the present invention.

Specifically, FIG. 14 describes one method for receiving (step 1410) an indication of a logical page, e.g. from a host, and returning the physical page mapped to that logical page. In step 1420, the table of FIG. 12 is accessed, at the record corresponding to the logical page address or the floor value thereof. For example, if the logical page address obtained in step 1410 is 319, the record for which logical page address=288 is accessed. In this record, block#=3 and Firstpagenumber=32. It is appreciated that each record in the table of FIG. 12 refers to a "segment" including a plurality of logical pages (32 logical pages in the illustrated example). So, the record accessed above indicates that the segment to which the current logical page belongs, is stored in erase block 3 starting from logical page 32 within that erase block. The Occupyvec field of the above record indicates whether or not each logical page in the segment to which the record corresponds, is occupied; "1" indicating that the logical page is occupied (also termed herein "allocated") and "0" indicating that the logical page is unoccupied or unallocated. For example, in the segment in question, the first, third, fourth, fifth and sixth logical pages are occupied, and the second logical page is not (as evident from the fact that the first 6 bits in the OccupyVec field of the record corresponding to logicalPageAdress=288, are 101111 respectively.

Figure 13:
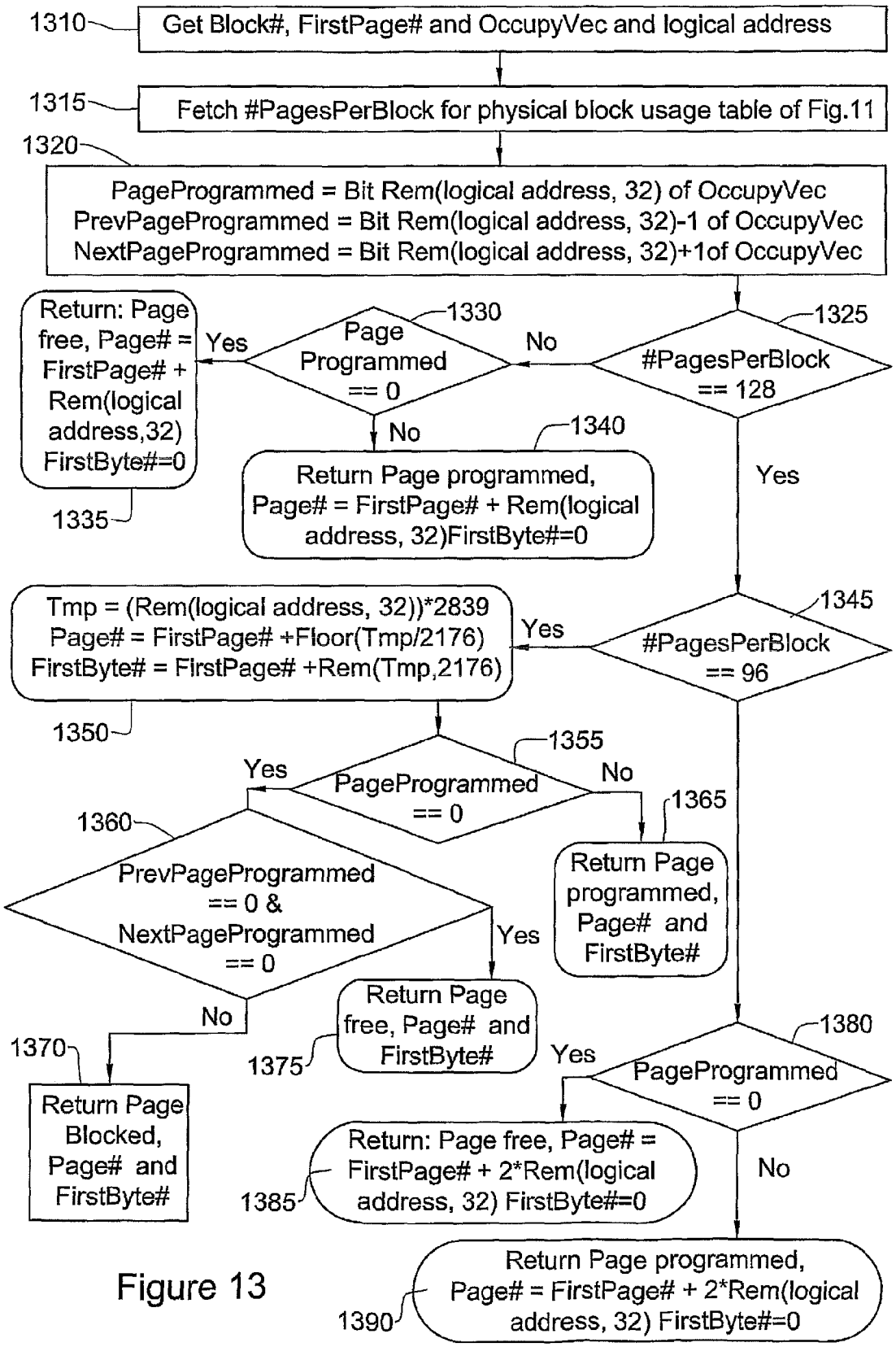
FIGS. 13 and 14 are simplified flowchart illustrations of methods for locating a logical page, in accordance with certain embodiments of the present invention.

If the logical page is not allocated i.e. does not contain data, an "unallocated" indication is returned (step 1440); if it is allocated, the physical address of the logical page in question, within the erase block whose serial number is Block#, is computed (step 1450). One suitable method of performing step 1450 is illustrated in FIG. 13. The output of the method of FIG. 14 includes (step 1460) the block in which the logical page whose address was obtained in step 1410 is stored or is to be stored, the number of the physical page within that block at which the logical page is stored or is to be stored, the number of the byte within that physical page at which the logical page is stored (since the beginning of each logical page generally does not correspond to the beginning of the physical page) and the status of the logical page: either programmed, free or blocked; or unallocated (step 1440).

FIG. 13 is a possible implementation of FIG. 14, step 1450 and comprises a method for finding a physical address of a known logical page on which to write or from which to read, within a known block, all as a function of a previously effected mapping between physical and logical pages. As described above, the block number (Block#) is known. The variables to be obtained in step 1310 may be known e.g. from step 1420 of FIG. 14. In step 1315, the table of FIG. 11 is used to determine how many logical pages are stored in the block (block No. 3) in which the logical page in question resides. The answer, in the illustrated embodiment, may be either 64, 96 or 128; and in fact happens to be 96 as shown in the fourth record of FIG. 11 (which corresponds to block No. 3).

Step 1320 computes remainders after dividing logical addresses by 32. The remainder indicates the position of the logical page within its 32-page section (e.g. logical page 319 is 31$^{st}$ within its section). Therefore, the remainder Stipulates the bit within the OccupyVec vector which pertains to the logical page in question. Step 1320 collects information as to whether the logical page, and the pages just before and after it, are or are not programmed.

The method now typically proceeds according to the number of pages per block which in the illustrated embodiment, may be either 64, 96 or 128. In each case, the byte within the physical page starting from which the logical page is or is to be stored, is computed, and an indication is provided of whether the page is free i.e. both it and its neighbors are unoccupied or unallocated, blocked (i.e. free but with at least one occupied neighbor) or allocated.

Page status may be used in reading. For example, FIG. 15 is a simplified flowchart illustration of a "read logical page" method which may be performed by the uController 1100 of FIG. 8, in accordance with certain embodiments of the present invention. As shown, after a logical page address is obtained e.g. from a host (step 1510) and the physical address of that logical page is located e.g using the method of FIG. 14 (step 1520), the method proceeds depending on whether or not the logical page is found to be programmed. If not, the logical page buffer 1170 in step 1540 is reset (e.g. with zeros). If the logical page is programmed, it is decoded (step 1590), using one of the three (in the illustrated example) code rates, as determined (step 1560) by the number of pages in the block in which the logical page is stored.

Page status may also be used in writing. For example, FIG. 17 is a simplified flowchart illustration of a page writing method, operative in accordance with certain embodiments of the present invention. According to the method of FIG. 17, a copy modify process is used to write on a particular logical page (step 2070), if the physical page storing the logical page and/or at least one of the neighbors of that physical page is found to be programmed (step 2030). In the copy modify process, which may follow the method of FIGS. 16A-16B, the erase block which stores the logical page in question is copied to another location and during the copying procedure the logical page in question is modified to store the new data. The original block is then erased (step 2080). The PagesPerBlock field is then updated depending on the cycle count Np since in the illustrated embodiment, the cycle count determines the code rate, using cut-off points of (say) 3000 and 5000.

Otherwise, i.e. if the physical page storing the logical page and both of its neighbors are unoccupied, the code rate is set (step 2040) depending on the value of the PagesPerBlock field in the table of FIG. 11 and the data is encoded at that rate (step 2050). The encoded data is then programmed into the flash (step 2060), at the appropriate physical address e.g. as determined by the method of FIG. 14.

Figure 16A:
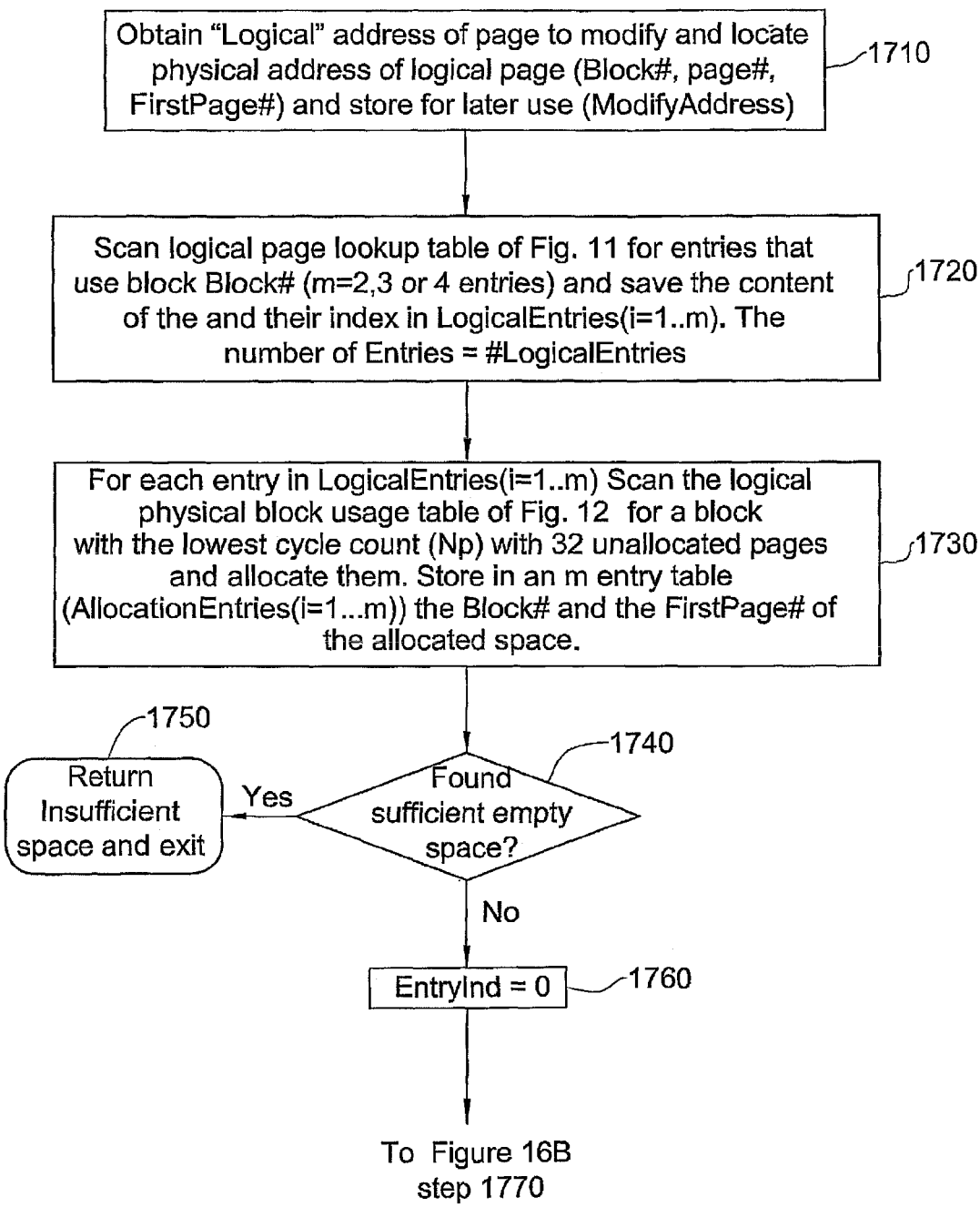
FIGS. 16A-16B, taken together, form a simplified flowchart illustration of a block copy and modify method, operative in accordance with certain embodiments of the present invention.
Figure 16B:
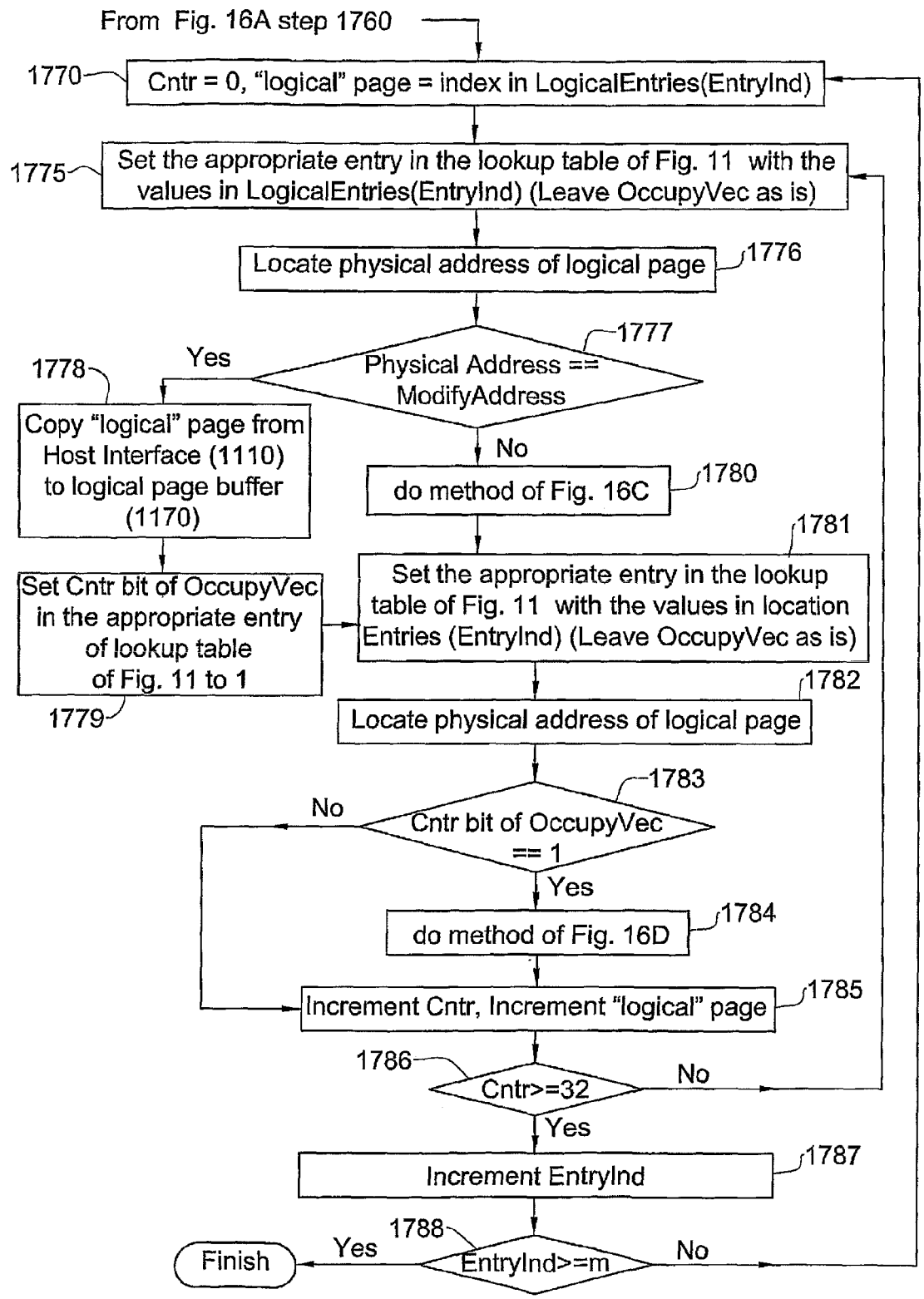
Figure 16C:
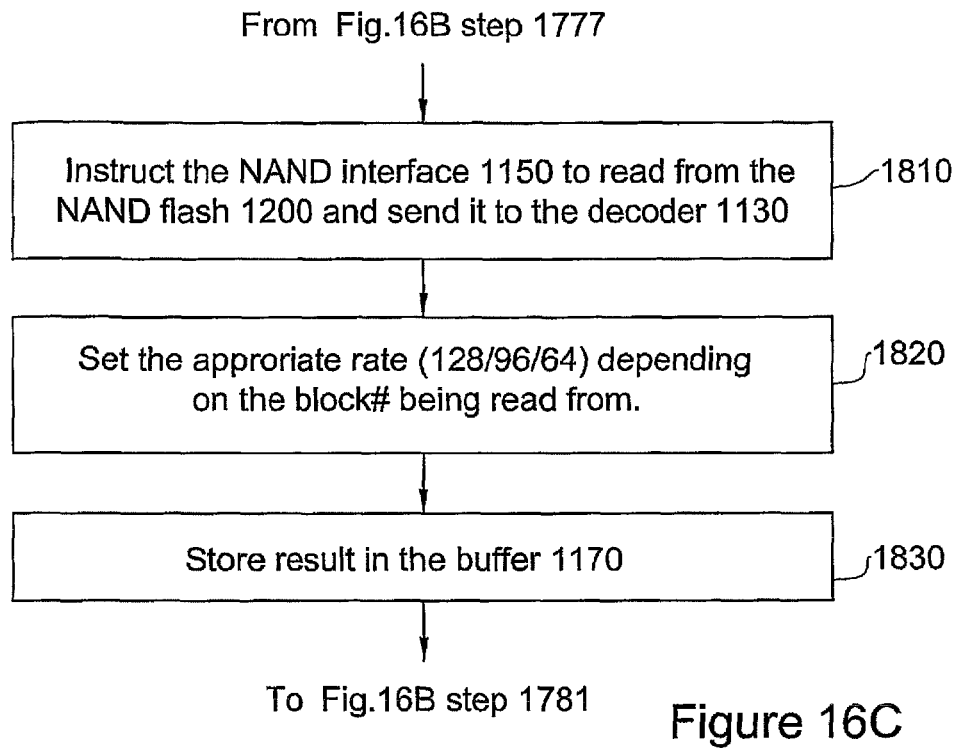
FIG. 16C is a simplified flowchart illustration of a method for performing step 1780 of FIG. 16B, in accordance with certain embodiments of the present invention.
Figure 16D:
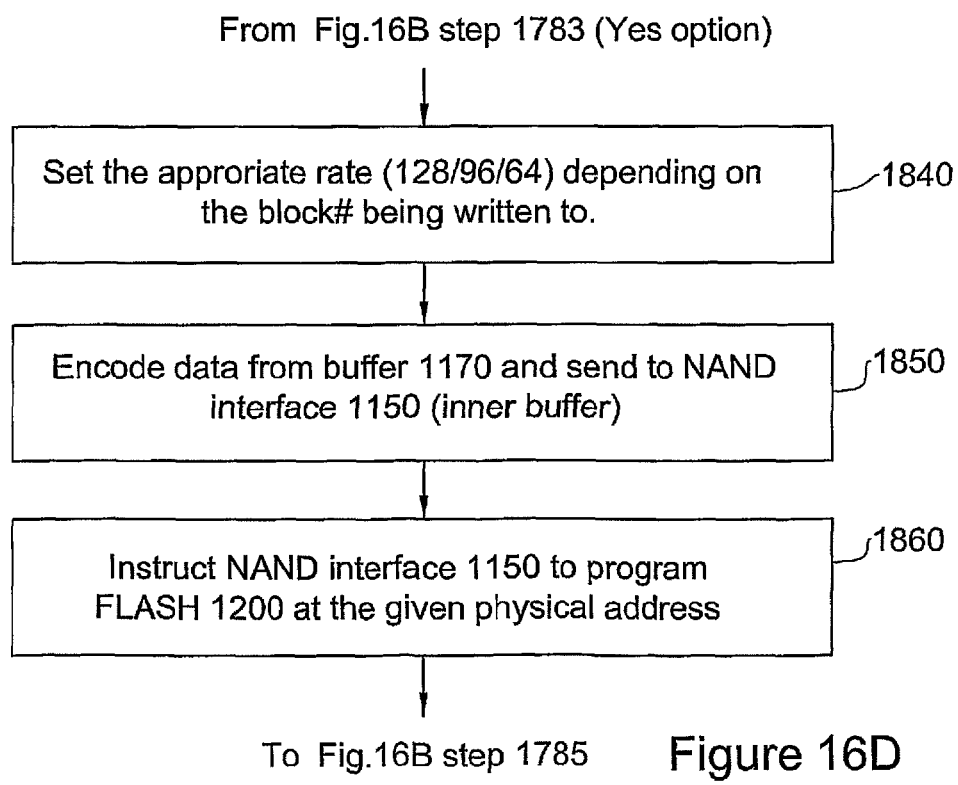
FIG. 16D is a simplified flowchart illustration of a method for performing step 1784 of FIG. 16B, in accordance with certain embodiments of the present invention.
Figure 17:
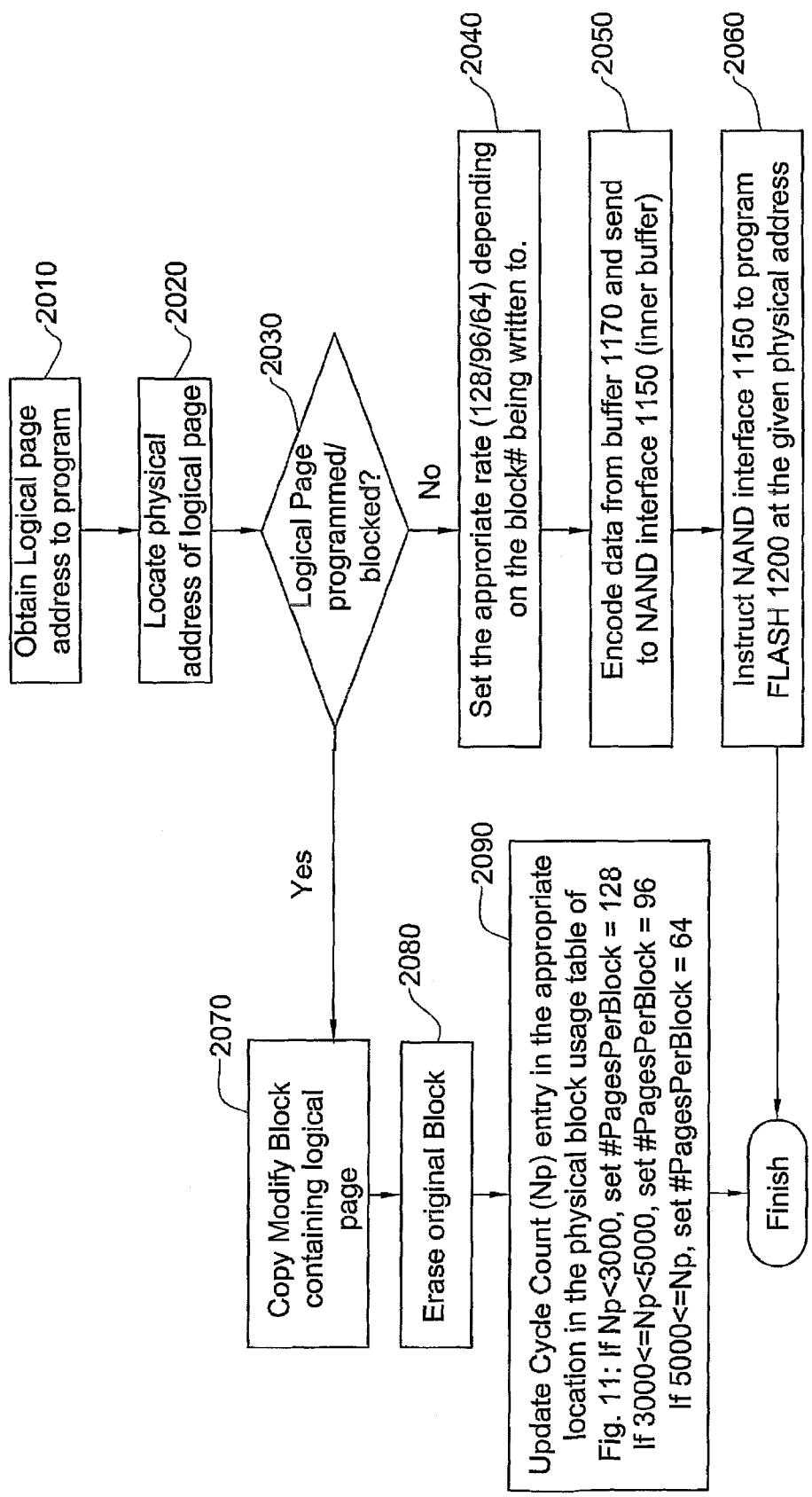
FIG. 17 is a simplified flowchart illustration of a page writing method, operative in accordance with certain embodiments of the present invention.

FIGS. 16A-16B, taken together, form a simplified flowchart illustration of a block copy and modify method, operative in accordance with certain embodiments of the present invention and suitable for implementing the copy-modify step 2070 of FIG. 17. FIG. 16C is a simplified flowchart illustration of a method for performing step 1780 of FIG. 16B, in accordance with certain embodiments of the present invention. FIG. 16D is a simplified flowchart illustration of a method for performing step 1784 of FIG. 16B, in accordance with certain embodiments of the present invention.

It is appreciated that software components of the present invention including programs and data may, if desired, be implemented in ROM (read only memory) form including CD-ROMs, EPROMs and EEPROMs, or may be stored in any other suitable computer-readable medium such as but not limited to disks of various kinds, cards of various kinds and RAMs. Components described herein as software may, alternatively, be implemented wholly or partly in hardware, if desired, using conventional techniques.

Included in the scope of the present invention, inter alia, are electromagnetic signals carrying computer-readable instructions for performing any or all of the steps of any of the methods shown and described herein, in any suitable order; machine-readable instructions for performing any or all of the steps of any of the methods shown and described herein, in any suitable order; program storage devices readable by machine, tangibly embodying a program of instructions executable by the machine to perform any or all of the steps of any of the methods shown and described herein, in any suitable order; a computer program product comprising a computer useable medium having computer readable program code having embodied therein, and/or including computer readable program code for performing, any or all of the steps of any of the methods shown and described herein, in any suitable order; any technical effects brought about by any or all of the steps of any of the methods shown and described herein, when performed in any suitable order; any suitable apparatus or device or combination of such, programmed to perform, alone or in combination, any or all of the steps of any of the methods shown and described herein, in any suitable order; information storage devices or physical records, such as disks or hard drives, causing a computer or other device to be configured so as to carry out any or all of the steps of any of the methods shown and described herein, in any suitable order; a program pre-stored e.g. in memory or on an information network such as the Internet, before or after being downloaded, which embodies any or all of the steps of any of the methods shown and described herein, in any suitable order, and the method of uploading or downloading such, and a system including server/s and/or client/s for using such; and hardware which performs any or all of the steps of any of the methods shown and described herein, in any suitable order, either alone or in conjunction with software.

Certain operations are described herein as occurring in the microcontroller internal to a flash memory device. Such description is intended to include operations which may be performed by hardware which may be associated with the microcontroller such as peripheral hardware on a chip on which the microcontroller may reside. It is also appreciated that some or all of these operations, in any embodiment, may alternatively be performed by the external, host-flash memory device interface controller including operations which may be performed by hardware which may be associated with the interface controller such as peripheral hardware on a chip on which the interface controller may reside. Finally it is appreciated that the internal and external controllers may each physically reside on a single hardware device, or alternatively on several operatively associated hardware devices.

Any data described as being stored at a specific location in memory may alternatively be stored elsewhere, in conjunction with an indication of the location in memory with which the data is associated. For example, instead of storing page- or erase-sector-specific information within a specific page or erase sector, the same may be stored within the flash memory device's internal microcontroller or within a microcontroller interfacing between the flash memory device and the host, and an indication may be stored of the specific page or erase sector associated with the cells.

It is appreciated that the teachings of the present invention can, for example, be implemented by suitably modifying, or interfacing externally with, flash controlling apparatus. The flash controlling apparatus controls a flash memory array and may comprise either a controller external to the flash array or a microcontroller on-board the flash array or otherwise incorporated therewithin. Examples of flash memory arrays include Samsung's K9XXG08UXM series, Hynix' HY27UK08BGFM Series, Micron's MT29F64G08TAAWP or other arrays such as but not limited to NOR or phase change memory. Examples of controllers which are external to the flash array they control include STMicroelectrocincs's ST7265x microcontroller family, STMicroelectrocincs's ST72681 microcontroller, and SMSC's USB97C242, Traspan Technologies' TS-4811, Chipsbank CBM2090/CBM1190. Examples of commercial IP software for Flash file systems are: Denali's Spectra™ NAND Flash File System, Aarsan's NAND Flash Controller IP Core and Arasan's NAND Flash File System. It is appreciated that the flash controller apparatus need not be NAND-type and can alternatively, for example, be NOR-type or phase change memory-type.

A Flash controlling apparatus, whether external or internal to the controlled flash array, typically includes the following components: a Memory Management/File system, a NAND interface (or other flash memory array interface), a Host Interface (USB, SD or other), error correction circuitry (ECC) typically comprising an Encoder and matching decoder, and a control system managing all of the above.

The present invention may for example interface with or modify, as per any of the embodiments described herein, one, some or all of the above components and particularly the ECC and memory management components. The memory management component, or a functional unit interacting therewith, is, according to certain embodiments of the present invention, able to handle different sizes of encoded pages over more than one physical page.

Features of the present invention which are described in the context of separate embodiments may also be provided in combination in a single embodiment. Conversely, features of the invention, including method steps, which are described for brevity in the context of a single embodiment or in a certain order may be provided separately or in any suitable subcombination or in a different order. "e.g." is used herein in the sense of a specific example which is not intended to be limiting.

The invention claimed is:

1. A method for encoding information arriving from a host in order to store said coded information in flash memory, the method comprising:
    encoding information arriving from a host for storage at a flash memory location including generating a number of redundancy bytes, the encoding proceeding at an encoding rate which is a function of the number of redundancy bytes to be generated, said encoding including:
        determining an effective error rate, including an anticipated rate of expected reading errors, for the flash memory location; and
        selecting the encoding rate as a function of said effective error rate such that said number of redundancy bytes is sufficient to overcome said anticipated rate of expected reading errors with a predetermined degree of certainty.

2. The method according to claim 1 wherein said flash memory location comprises a page.

3. The method according to claim 1 wherein said determining comprises determining a rate of expected reading errors assuming reading occurs after a time period T, based on known data on frequency of errors when information is read from a flash memory which has undergone a simulation of effects of passage of said time period T.

4. The method according to claim 1 wherein said determining comprises reading a stored effective error rate, identifying a time t at which said effective error rate was stored, and updating said effective error rate as a function of said stored effective error rate and said time, to take into account spontaneous recovery of the flash memory location, over time, from effects of some of the program cycles to which the flash memory location has been subjected.

5. The method according to claim 4 wherein said updating comprises finding, for at least one stored number of program cycles to which the flash memory location was subjected at time t, a number of program cycles to which the flash memory location is subjected currently, after which the rate of errors currently read from said flash memory location equals the rate of errors currently read from said flash memory location which was subjected to said stored number of program cycles at time t.

6. A method according to claim 4 wherein said identifying a time t at which said effective error rate was stored, comprises associating a timer with said flash memory location, capable of generating a time stamp each time an operation is performed upon said flash memory location and storing at least one said time stamp.

7. A method according to claim 6 wherein said operation comprises a flash memory location reading operation.

8. A method according to claim 4 wherein said identifying a time t at which said effective error rate was stored comprises reading said flash memory location including quantifying and correcting errors encountered, and estimating the time of last programming as a function of said quantification of errors encountered.

9. The method according to claim 1 wherein said flash memory device comprises an NROM flash memory device.

10. A method according to claim 1 wherein said effective error rate for an individual flash memory location is stored adjacent said individual flash memory location.

11. A method according to claim 10 wherein said flash memory location comprises a page and said effective error rate for said page is stored within said page.

12. A method according to claim 11 wherein said effective error rate is encoded at a fixed coding rate corresponding to a fixed number of redundancy bytes which is high enough to overcome expected corruptions of said effective error rate.

13. A method according to claim 1 wherein said encoding, determining and selecting are performed for a plurality of flash memory locations.

14. A system for encoding information arriving from a host in order to store said coded information in flash memory, the system comprising:
- a variable rate encoder operative to encode information arriving from a host for storage at a flash memory location including generating a number of redundancy bytes, the encoding proceeding at an encoding rate which is a function of the number of redundancy bytes generated, said variable rate encoder including:
  - an error rate definer operative to determine an effective error rate, including an anticipated rate of expected reading errors, for the flash memory location; and
  - an encoding rate definer selecting the encoding rate as a function of said effective error rate such that said number of redundancy bytes is sufficient to overcome said anticipated rate of expected reading errors with a predetermined degree of certainty.

* * * * *